United States Patent
Park et al.

(10) Patent No.: US 12,495,593 B2
(45) Date of Patent: Dec. 9, 2025

(54) METHOD OF MANUFACTURING SEMICONDUCTOR DEVICE

(71) Applicant: SAMSUNG ELECTRONICS CO., LTD., Suwon-si (KR)

(72) Inventors: Chankyo Park, Suwon-si (KR); Seungchul Oh, Suwon-si (KR); Jaeho Jeon, Suwon-si (KR); Sunggi Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 491 days.

(21) Appl. No.: 17/989,936

(22) Filed: Nov. 18, 2022

(65) Prior Publication Data

US 2023/0335618 A1   Oct. 19, 2023

(30) Foreign Application Priority Data

Apr. 19, 2022   (KR) .................. 10-2022-0048302

(51) Int. Cl.
*H01L 29/66*   (2006.01)
*H01L 29/06*   (2006.01)
(Continued)

(52) U.S. Cl.
CPC ......... *H10D 64/017* (2025.01); *H10D 30/014* (2025.01); *H10D 30/031* (2025.01);
(Continued)

(58) Field of Classification Search
CPC .. H10D 64/017; H10D 30/014; H10D 30/031; H10D 30/43; H10D 30/6735; H10D 62/121; H10D 30/6757; H10D 62/822; H10D 84/0151; H10D 84/038; H10D 84/83; H10D 84/0135; H10D 84/853; B82Y 10/00
(Continued)

(56) References Cited

U.S. PATENT DOCUMENTS 10,269,787 B2   4/2019  Wang et al.
10,431,673 B2   10/2019 Kim
(Continued)

FOREIGN PATENT DOCUMENTS

KR   10-2018-0134542 A   12/2018
KR   10-2162415 B1   10/2020

OTHER PUBLICATIONS

Office Action dated Jul. 1, 2025, issued by Korean Patent Office in Korean Patent Application No. 10-2022-0048302.

*Primary Examiner* — Tong-Ho Kim
(74) *Attorney, Agent, or Firm* — Sughrue Mion, PLLC

(57) ABSTRACT

A method of manufacturing a semiconductor device is provided. The method includes: forming, on a substrate, dummy gate structures extending in a first direction, spaced apart from one another along a second direction, forming a first oxide layer on the dummy gate structures, etching an upper portion of the first oxide layer and the dummy gate to form a recess region, providing a first nitride layer in the recessed region, forming a second oxide layer on the first nitride layer and the first oxide layer, partially removing upper portions of the first oxide layer and the second oxide layer and providing a second nitride layer on the first and second oxide layers.

20 Claims, 30 Drawing Sheets

(51) Int. Cl.
*H01L 29/423* (2006.01)
*H01L 29/775* (2006.01)
*H10D 30/01* (2025.01)
*H10D 30/43* (2025.01)
*H10D 30/67* (2025.01)
*H10D 62/10* (2025.01)
*H10D 64/01* (2025.01)

(52) U.S. Cl.
CPC ......... *H10D 30/43* (2025.01); *H10D 30/6735* (2025.01); *H10D 62/121* (2025.01)

(58) Field of Classification Search
USPC ....................................................... 257/347
See application file for complete search history.

(56) References Cited

U.S. PATENT DOCUMENTS

| | | |
|---|---|---|
| 10,468,527 B2 | 11/2019 | Yang et al. |
| 10,714,347 B2 | 7/2020 | Jang et al. |
| 10,879,074 B2 | 12/2020 | Jang et al. |
| 10,930,749 B2 | 2/2021 | Jeon et al. |
| 11,069,680 B2 | 7/2021 | Xie et al. |
| 11,177,180 B2 | 11/2021 | Wu et al. |
| 2020/0006354 A1 | 1/2020 | Wen et al. |
| 2020/0227323 A1 | 7/2020 | Zang et al. |
| 2021/0272856 A1* | 9/2021 | Pan .................... H10D 30/6757 |

* cited by examiner

I - I'

III – III'

III - III'

III - III'

II - II'

III — III'

METHOD OF MANUFACTURING SEMICONDUCTOR DEVICE

CROSS-REFERENCE TO RELATED APPLICATIONS

This application is based on and claims priority under 35 U.S.C. § 119 to Korean Patent Application No. 10-2022-0048302, filed on Apr. 19, 2022, in the Korean Intellectual Property Office, the disclosure of which is incorporated by reference herein in its entirety.

BACKGROUND

The present disclosure relates to a method of manufacturing a semiconductor device, and more particularly, to a method of manufacturing a semiconductor device related to a gate cut.

As the size of a semiconductor device decreases, it is necessary to increase the degree of integration of field effect transistors (FETs) on a substrate. Therefore, a nano-sheet FET including stacked nano-sheets is being developed. As the degree of integration of a semiconductor device increases and the sizes of elements decrease, it is becoming increasingly difficult to implement a nano-sheet FET. A nano-sheet FET may be manufactured through a replacement metal gate (RMG) process, which is called as a gate last scheme. The RMG process may refer to a process of removing a dummy gate and replacing it with a metal gate.

SUMMARY

The present disclosure provides a method of manufacturing a semiconductor device in which defects in source/drain contacts may be prevented.

In addition, the technical goals to be achieved are not limited to the technical goals mentioned above, and other technical goals may be clearly understood by one of ordinary skill in the art from the following descriptions.

According to an aspect of an embodiment, there is provided a method of manufacturing a semiconductor device. The method includes: forming, on a substrate, dummy gate structures extending in a first direction, spaced apart from one another along a second direction perpendicular to the first direction, and each including a dummy gate and a gate mask pattern; forming a first oxide layer on the dummy gate structures; removing upper portions of the first oxide layer and the dummy gate structures through chemical mechanical polishing (CMP) to expose the dummy gate; etching an upper portion of the first oxide layer and the dummy gate by using a hard mask pattern to form a recessed region; providing a first nitride layer in the recessed region; removing an upper portion of the first nitride layer to expose the first oxide layer; forming a second oxide layer on the first nitride layer and the first oxide layer; removing an upper portion of the second oxide layer and the hard mask pattern to expose the dummy gate; partially removing upper portions of the first oxide layer and the second oxide layer; and providing a second nitride layer on the first oxide layer and the second oxide layer.

According to an aspect of an embodiment, there is provided a method of manufacturing a semiconductor device. The method includes: forming a fin and a nano-sheet on a substrate; forming, on the nano-sheet, dummy gate structures extending in a first direction, spaced apart from one another along a second direction perpendicular to the first direction, and each including a dummy gate and a gate mask pattern; forming source and drain regions connected to the nano-sheet, on the substrate between the dummy gate structures; forming a first oxide layer on the source and drain regions and the dummy gate structures; removing upper portions of the first oxide layer and the dummy gate structures through chemical mechanical polishing (CMP) to expose the dummy gate; etching an upper portion of the first oxide layer and the dummy gate by using a hard mask pattern to form a recessed region; providing a first nitride layer in the recessed region; removing an upper portion of the first nitride layer to expose the first oxide layer; forming a second oxide layer on the first nitride layer and the first oxide layer; removing an upper portion of the second oxide layer and the hard mask pattern to expose the dummy gate; removing upper portions of the first oxide layer and the second oxide layer; forming a second nitride layer on the first oxide layer and the second oxide layer; removing the dummy gate; forming a metal gate; removing the second nitride layer and the second oxide layer; removing the first oxide layer; and forming a contact.

According to an aspect of an embodiment, there is provided a semiconductor device. The semiconductor device includes: a semiconductor substrate; fins protruding from the semiconductor substrate, extending in a first direction, and spaced apart from one another along a second direction perpendicular to the first direction; a plurality of nano-sheets spaced apart from top surfaces of the fins and extending in the first direction parallel to the top surfaces of the fins; metal gates extending in the second direction, spaced apart from each other along the first direction, and surrounding the plurality of nano-sheets with a gate insulation layer provided therebetween; and a nitride layer and a first oxide layer provided in a gate cut region between the metal gates, wherein the first oxide layer is provided on the nitride layer.

BRIEF DESCRIPTION OF THE DRAWINGS

The above and other aspects and features will be more apparent from the following description of embodiments, taken in conjunction with the accompanying drawings, in which.

DETAILED DESCRIPTION

Hereinafter, embodiments are described in conjunction with the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
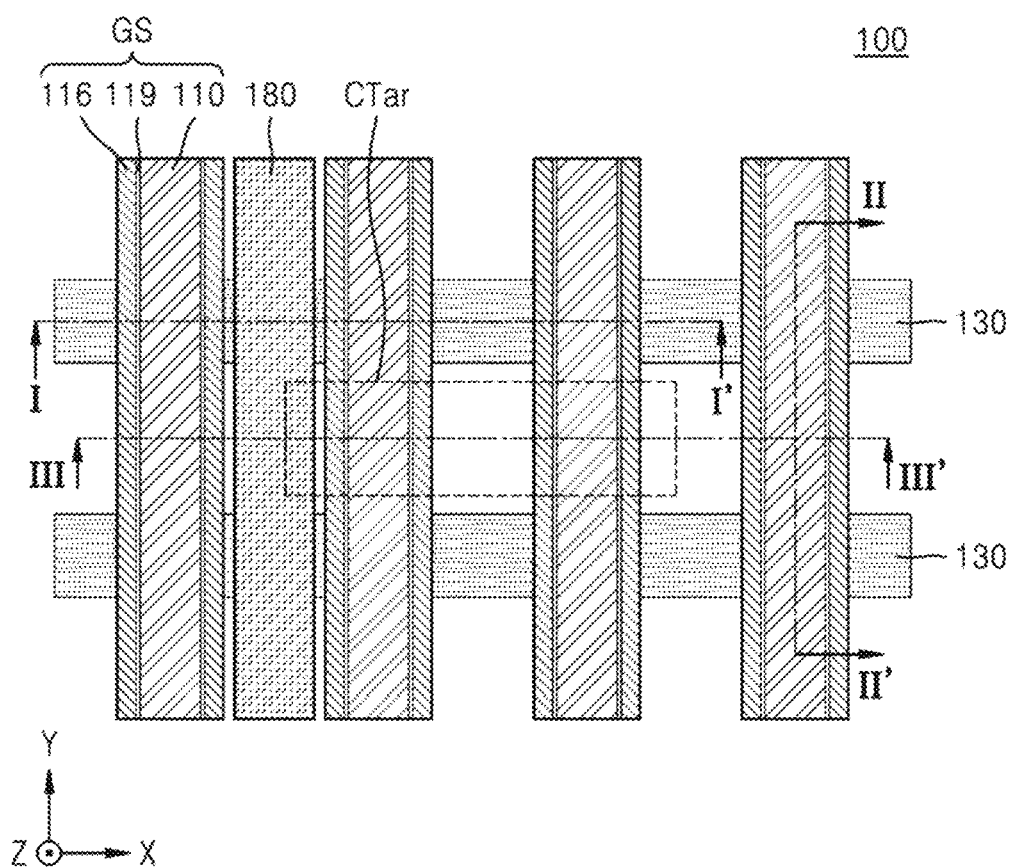
FIG. 1 is a plan view of a semiconductor device according to an embodiment.
Figure 2A:
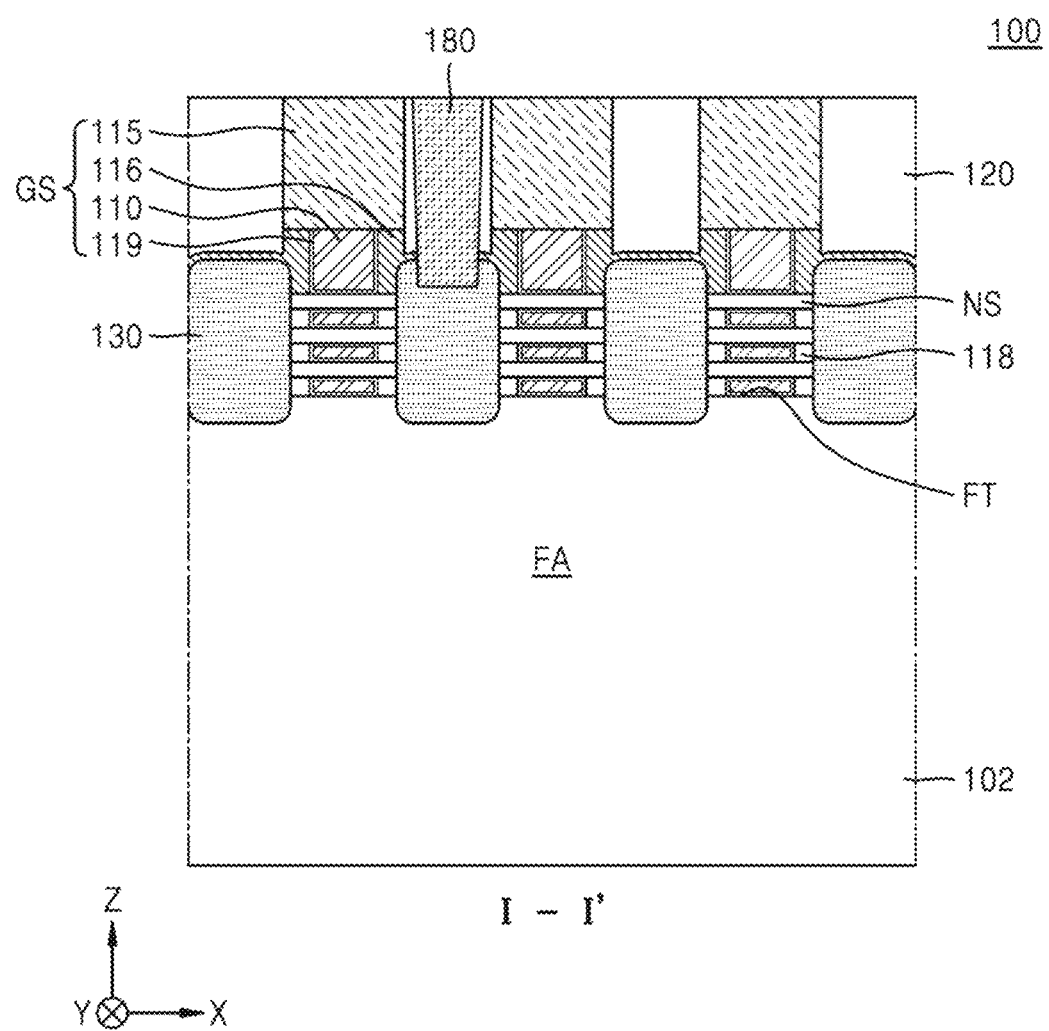
FIGS. 2A, 2B and 2C are cross-sectional views taken along lines I-I', II-II', and III-III' of FIG. 1, respectively.
Figure 2B:
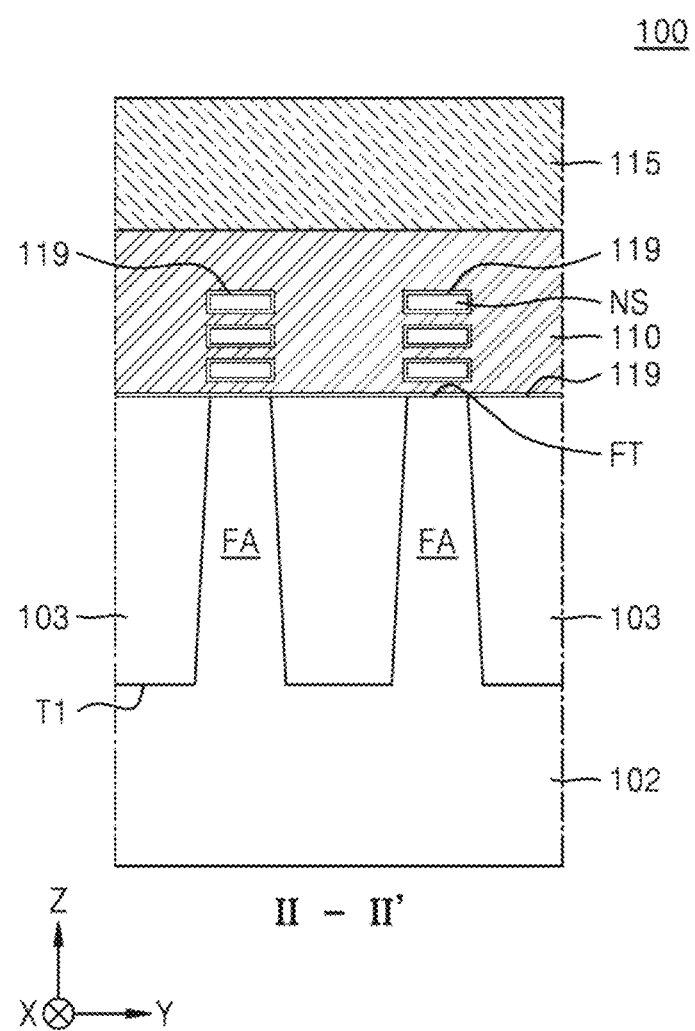
Figure 2C:
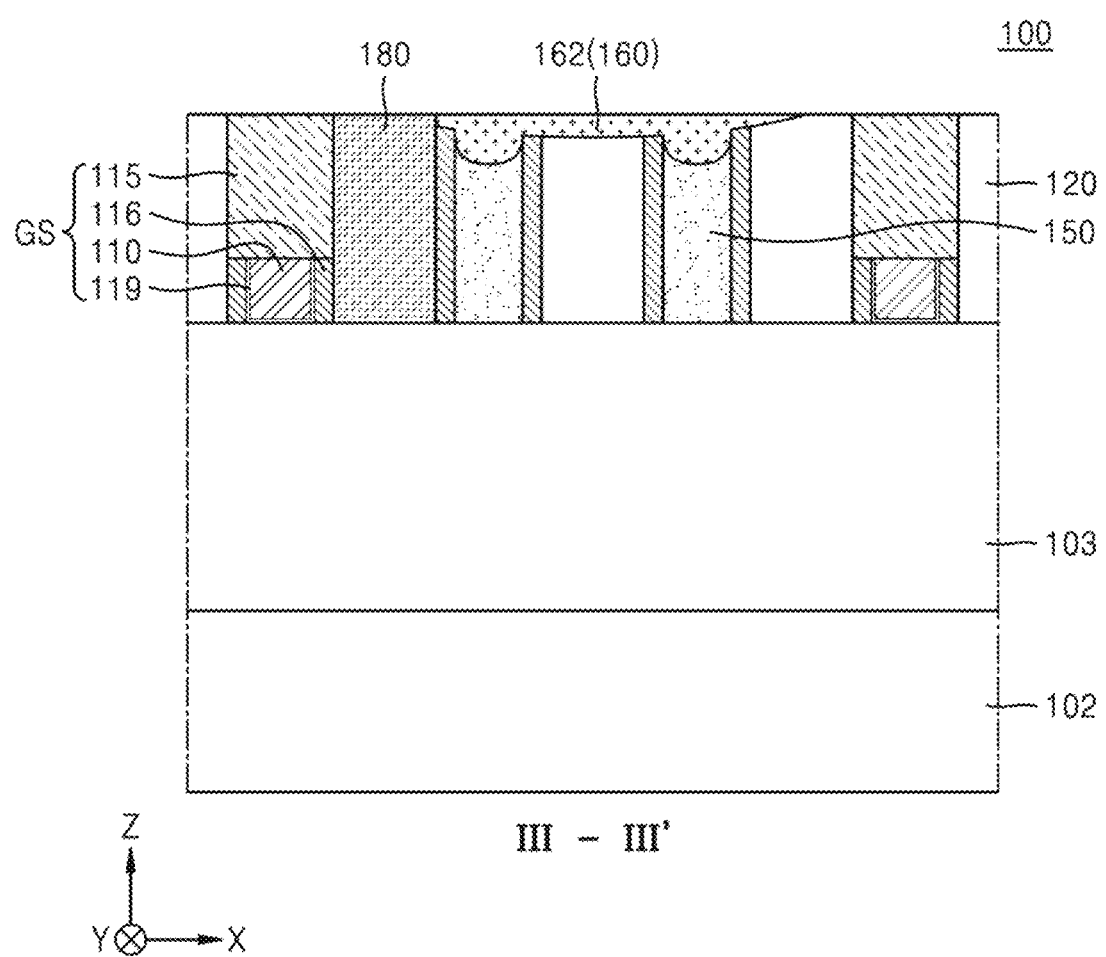

FIG. 1 is a plan view of a semiconductor device according to an embodiment, and FIGS. 2A to 2C are cross-sectional views taken along lines I-I', II-II', and III-III' of FIG. 1.

Referring to FIGS. 1 to 2C, a semiconductor device 100 may include a substrate 102, fins FA, nano-sheets NS, and gate structures GS. The semiconductor device 100 may be a nano-sheet field effect transistor (FET). A nano-sheet FET has a structure in which a metal gate 110 surrounds four surfaces of a nano-sheet NS, and thus the nano-sheet FET may correspond to a gate all around FET (GAAFET). The semiconductor device 100 may include, for example, a static random-access memory (SRAM) based on a nano-sheet FET or may be a logic device. However, the semiconductor device 100 is not limited to the above-stated devices.

The substrate 102 may include a semiconductor material, such as silicon Si or Ge, or a compound semiconductor material, such as SiGe, SiC, GaAs, InAs, or InP. According to some embodiments, the substrate 102 may include at least one of a Group III-V material and a Group IV material. The Group III-V material may be a binary, ternary, or quaternary compound including at least one Group III element and at least one Group V element. The Group III-V material may be a compound including at least one of In, Ga, and Al as a Group III element and at least one of As, P, and Sb as a Group V element. A Group III-V material and a Group IV material, such as Ge, may be used as channel materials for fabricating a low-power and high-speed transistor. A high-performance complementary metal-oxide-semiconductor (CMOS) may be implemented by using a substrate including a group III-V material having high electron mobility (e.g., GaAs) as compared to a Si substrate and a substrate including a semiconductor material having high hole mobility (e.g., Ge) as compared to a Si substrate.

In some embodiments, in the case of forming an N-type metal-oxide-semiconductor (NMOS) transistor on a portion of the substrate 102, the portion of the substrate 102 may include any one of the Group III-V materials stated above. According to some embodiments, in the case of forming a P-type metal-oxide-semiconductor (PMOS) transistor on the substrate 102, at least a portion of the substrate 102 may include Ge. According to some embodiments, the substrate may have a silicon-on-insulator (SOI) structure. The substrate 102 may include a conductive region, e.g., a well doped with an impurity or a structure doped with an impurity.

A device isolation layer 103 defining fins FA may be formed on the substrate 102. The device isolation layer 103 may include an insulation liner that conformally covers inner walls of a trench and a gap-fill insulation layer on the insulation liner. The insulation liner may include an oxide layer, SiN, SiON, SiBN, SiC, SiC:H, SiCN, SiCN:H, SiOCN, SiOCN:H, SiOC, SiO2, polysilicon, or a combination thereof. According to some embodiments, the gap-fill insulation layer may include an oxide layer. For example, the gap-fill insulation layer may include fluoride silicate glass (FSG), undoped silicate glass (USG), boro-phospho-silicate glass (BPSG), phospho-silicate glass (PSG), flowable oxide (FOX), plasma enhanced (PE-TEOS). tetra-ethyl-ortho-silicate), or tonen silazane (TOSZ). However, the material of the gap-fill insulation layer is not limited to the above-stated materials.

As shown in FIG. 2B, the level of the top surface of a fin FA may be substantially the same as or similar to the level of the top surface of the device isolation layer 103. The fins FA may each have a structure protruding from the substrate 102, may extend in a first direction (X direction), and may be spaced apart from each other in a second direction (Y direction). For example, although two fins FA are illustrated in FIG. 2B, the number of the fins FA is not limited to two. For example, three or more fins FA may be disposed.

A plurality of nano-sheets NS may be arranged over each of the fins FA. For example, three nano-sheets NS stacked apart from one another in a third direction (Z direction) may be arranged over each of the fins FA. However, the number of nano-sheets NS over the fin FA is not limited to three. For example, one, two, four, or more nano-sheets NS may be arranged over a corresponding fin FA.

The nano-sheets NS may each have a sheet structure. For example, the nano-sheets NS may each have a sheet structure having a thickness of several nm in the third direction (Z direction) and having widths from several nm to dozens of nm in the first direction (X direction) and the second direction (Y direction). Of course, the dimension of the nano-sheet NS is not limited to the above-stated numerical values. Four surfaces of each of the nano-sheets NS may be surrounded by the metal gate 110. For example, the top surface, the bottom surface, and side surfaces in the second direction (Y direction) of the nano-sheet NS may be surrounded by the metal gate 110.

In some embodiments, the nano-sheet NS may include substantially the same material as the substrate 102. For example, the nano-sheet NS may include silicon (Si) or silicon germanium (SiGe). Of course, the material of the nano-sheet NS is not limited to the above-stated materials.

The nano-sheet NS may constitute a channel region of a transistor. For example, as shown in FIG. 2A, the three nano-sheets NS may be arranged between source/drain regions 130 and function as channel regions. Also, by adjusting the thickness of the nano-sheet NS, the channel width of a transistor and a channel current depending on the channel width may be adjusted. On the other hand, when the thickness of the nano-sheet NS is maintained at a very small thickness of about several nm, a quantum confinement effect may occur, and, by using the quantum confinement effect, a threshold voltage Vt of a transistor may be adjusted.

Metal gates 110 may extend over the substrate 102 in the second direction (Y direction) across the fins FA. As shown in FIG. 1, the metal gates 110 may be disposed to perpendicularly intersect the fins FA. However, the metal gate 110 may intersect the fins FA at a non-perpendicular angle. Also, although each of the metal gates 110 intersects two fins FA, embodiments are not limited thereto. For example, each of the metal gates 110 may intersect three or more fins FA.

A gate insulation layer 119 may be disposed between the metal gate 110 and the nano-sheet NS and between the metal gate 110 and the fin FA. The gate insulation layer 119 may be formed as a stacked structure of an interfacial layer and a high-k layer. The interfacial layer may serve to cure interfacial defects between the top surface of the fin FA and the high-k layer and between the surface of the nano-sheet NS and the high-k layer. According to some embodiments, the interfacial layer may include a low-k material layer having a dielectric constant of about 9 or less, e.g., a silicon oxide layer, a silicon oxynitride layer, or a combination thereof. According to some other embodiments, the interfacial layer may include a silicate, a combination of a silicate and a silicon oxide layer, or a combination of a silicate and a silicon oxynitride layer. According to some embodiments, the interfacial layer may be omitted.

The high-k layer may include a material having a higher dielectric constant than that of a silicon oxide layer. For example, the high-k layer may have a dielectric constant from about 10 to about 25. The high-k layer may include a hafnium-based (Hf-based) material or a zirconium-based (Zr-based) material. For example, the high-k layer may include hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$), zirconium silicon oxide (ZrSiO), etc.

Also, the material constituting the high-k layer is not limited to hafnium-based (Hf-based) materials or zirconium-based (Zr-based) materials and may include other materials, such as lanthanum oxide ($La_2O_3$), lanthanum aluminum oxide ($LaAlO_3$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate ($PbZnNbO_3$), etc.

The high-k layer may be formed through an atomic layer deposition (ALD) process, a chemical vapor deposition (CVD) process, or a physical vapor deposition (PVD) process. For example, the high-k layer may have a thickness from about 10 Å to about 40 Å. However, the thickness of the high-k layer is not limited thereto.

The metal gate 110 may include a work-function controlling metal-containing layer and a gap-filling metal-containing layer for filling a space above the work-function controlling metal-containing layer. According to some embodiments, the metal gate 110 may have a structure in which a metal nitride layer, a metal layer, a conductive capping layer, and a gap-filling metal-containing layer are sequentially stacked. The metal nitride layer and the metal layer may each include at least one metal selected from among Ti, W, Ru, Nb, Mo, Hf, Ni, Co, Pt, Yb, Tb, Dy, Er, and Pd. The metal nitride layer and the metal layer may each be formed through an ALD process, a metal organic ALD (MOALD) process, or a metal organic CVD (MOCVD) process. The conductive capping layer may serve as a protective layer that prevents a surface of the metal layer from being oxidized. Also, the conductive capping layer may serve as a wetting layer to facilitate deposition of another conductive layer on the metal layer. The conductive capping layer may include a metal nitride, such as TiN, TaN, or a combination thereof, but is not limited thereto. A gap-filling metal-containing layer may extend over the conductive capping layer. The gap-filling metal-containing layer may include W. The gap-filling metal-containing layer may be formed through an ALD process, a CVD process, or a PVD process. The gap-filling metal-containing layer may fill a recess space formed by a step portion between regions on the top surface of the conductive capping layer without a void. According to some embodiments, the metal gate 110 may have a stacked structure of TiAlC/TiN/W, a stacked structure of TiN/TaN/TiAlC/TiN/W, or a stacked structure of TiN/TaN/TiN/TiAlC/TiN/W. In the above-stated stacked structures, a TiAlC layer or a TiN layer may serve as a work-function controlling metal-containing layer.

The gate structure GS may include a cap layer 115 on the metal gate 110 and a spacer 116. The cap layer 115 may include, for example, a silicon nitride layer. Also, the cap layer 115 may be formed through a self-alignment process.

The source/drain regions 130 may be arranged on the fins FA on both sides of the metal gate 110 in the first direction (X direction). The source/drain region 130 may be connected to one end of an adjacent nano-sheet NS. For example, the source/drain regions 130 may be commonly connected to the three nano-sheets NS.

The source/drain region 130 may include a semiconductor layer epitaxially grown from the nano-sheet NS. For example, the source/drain regions 130 may include an epitaxially grown Si layer, an epitaxially grown SiC layer, an epitaxially grown SiGe layer, etc. In the case of the SiGe layer, the source/drain region 130 may be formed as an embedded SiGe structure including a plurality of SiGe layers. The source/drain region 130 may further include a metal silicide layer formed on the semiconductor layer. According to some embodiments, the metal silicide layer may include titanium silicide, but embodiments are not limited thereto. In some embodiments, the metal silicide layer may be omitted.

As shown in FIG. 2A, the gate structure GS may include spacers 116 on both sidewalls of the metal gate 110 in the first direction (X direction). The gate insulation layer 119 may be provided between the metal gate 110 and the spacer 116. Also, a portion of the spacer 116 may extend to cover the source/drain region 130. The spacer 116 may include a silicon nitride layer, but embodiments are not limited thereto.

An insulation spacer 118 contacting the source/drain region 130 may be disposed in a space between the nano-sheets NS. The insulation spacer 118 may be provided in a space between the nano-sheets NS in the third direction (Z direction) and between the nano-sheets NS and the source/drain region 130 in the first direction (X direction). The spacer 116 and the insulation spacer 118 may include different materials. According to some embodiments, the spacer 116 may include a silicon nitride layer, and the insulation spacer 118 may include a silicon nitride layer further containing oxygen (O) atoms, boron (B) atoms, carbon (C) atoms, or combinations thereof. For example, the spacer 116 may include a SiN layer, and the insulation spacer 118 may include an SiON layer.

According to some embodiments, at least some of insulation spacers 118 may include air spaces. Also, the insulation spacer 118 may have a multi-layered structure. According to some embodiments, the insulation spacer 118 may include at least one selected from among air spaces, SiN, SiCN, SiBN, SiON, SiOCN, SiBCN, SiOC, and $SiO_2$. For example, the insulation spacer 118 may have at least a triple layer structure. At least a portion of the triple layer structure may be an air space.

An interlayer insulation layer 120 may be disposed on side surfaces and the top surface of the source/drain region 130. The interlayer insulation layer 120 may include an oxide layer. For example, the interlayer insulation layer 120 may include TOSZ. However, the material constituting the interlayer insulation layer 120 is not limited to TOSZ. For example, similar to the device isolation layer 103 described above, the interlayer insulation layer 120 may include various types of oxide layers.

A source/drain contact 180 may be connected to the source/drain region 130. The source/drain contact 180 may penetrate through the interlayer insulation layer 120 and be connected to the source/drain region 130. A metal silicide layer may be provided between the semiconductor layer constituting the source/drain region 130 and the source/drain contact 180. The source/drain contact 180 may include a metal, a conductive metal nitride, or a combination thereof. For example, the source/drain contact 180 may include W, Cu, Al, Ti, Ta, TiN, TaN, an alloy thereof, or a combination thereof. However, the material constituting the source/drain contact 180 is not limited to the above-stated materials.

The semiconductor device 100 may include a gate cut region CTar as shown by a dotted rectangle in FIG. 1. The metal gate 110 may be electrically cut off in the gate cut region CTar. For example, each of two metal gates 110 may each be cut off by a first nitride layer 150 in the gate cut region CTar and separated into two portions in the second direction (Y direction).

As shown in FIG. 1, the gate cut region CTar and the source/drain contact 180 may overlap each other. Even when the semiconductor device 100 has a structure in which the gate cut region CTar and the source/drain contact 180 overlap each other, the source/drain contact 180 may extend to the source/drain region 130 and the device isolation layer 103 below the source/drain contact 180 without being cut off by the gate cut region CTar. Therefore, the semiconductor device 100 may implement a reliable semiconductor device by preventing a failure of the source/drain contact 180 in the gate cut region CTar.

As shown in FIG. 2C, a portion of a buried oxide layer 160, e.g., a buffer layer 162, may be maintained on the first nitride layer 150 of the gate cut region CTar. However, according to some embodiments, the buffer layer 162 may not exist on the first nitride layer 150 of the gate cut region CTar. Also, according to some embodiments, a portion of a buried oxide layer 160, e.g., the buffer layer 162 and a portion of an upper oxide layer 164, may be maintained on the first nitride layer 150 of the gate cut region CTar.

Here, the source/drain contact 180 may be formed by etching the interlayer insulation layer 120 to form openings exposing the source/drain region 130 and the device isolation layer 103, and filling the openings with a metal. For comparison, a process in which a nitride layer remains on the interlayer insulation layer 120 corresponding to the source/drain contact 180 in the gate cut region CTar when the gate cut region CTar and the source/drain contact 180 overlap each other may be referred to as a comparative example. In this case, when the source/drain contact 180 is formed, an etching defect may occur due to the remaining nitride layer, and thus a defect in which the source/drain contact 180 is cut may occur. On the other hand, in the case of the semiconductor device 100, even when the gate cut region CTar and the source/drain contact 180 overlap each other, no nitride layer may remain on the interlayer insulation layer 120 corresponding to the source/drain contact 180 in the gate cut region CTar. Therefore, in the semiconductor device 100, when the source/drain contact 180 is formed, an oxide layer may be easily removed, and thus the source/drain contact 180 may be formed without being cut. Also, in the semiconductor device 100, because overlap between the gate cut region CTar and the source/drain contact 180 does not become a problem, a process may be performed without restriction of design rules. In this regard, it is possible to increase the degree of freedom of design.

FIGS. 3A to 15 are cross-sectional views showing a process of manufacturing the semiconductor device of FIG. 1 before a removal poly gate (RPG) process in a method of manufacturing a semiconductor device according to an embodiment, wherein FIGS. 3A to 8 are cross-sectional views taken along lines I-I' and II-II' of FIG. 1, and FIGS. 9 to 15 are cross-sectional views taken along a line III-III' of FIG. 1. Descriptions of FIGS. 3A to 15 will be given below with reference to FIGS. 1 to 2C, and descriptions already given above with reference to FIGS. 1 to 2C will be briefly given or omitted.

Figure 3A:
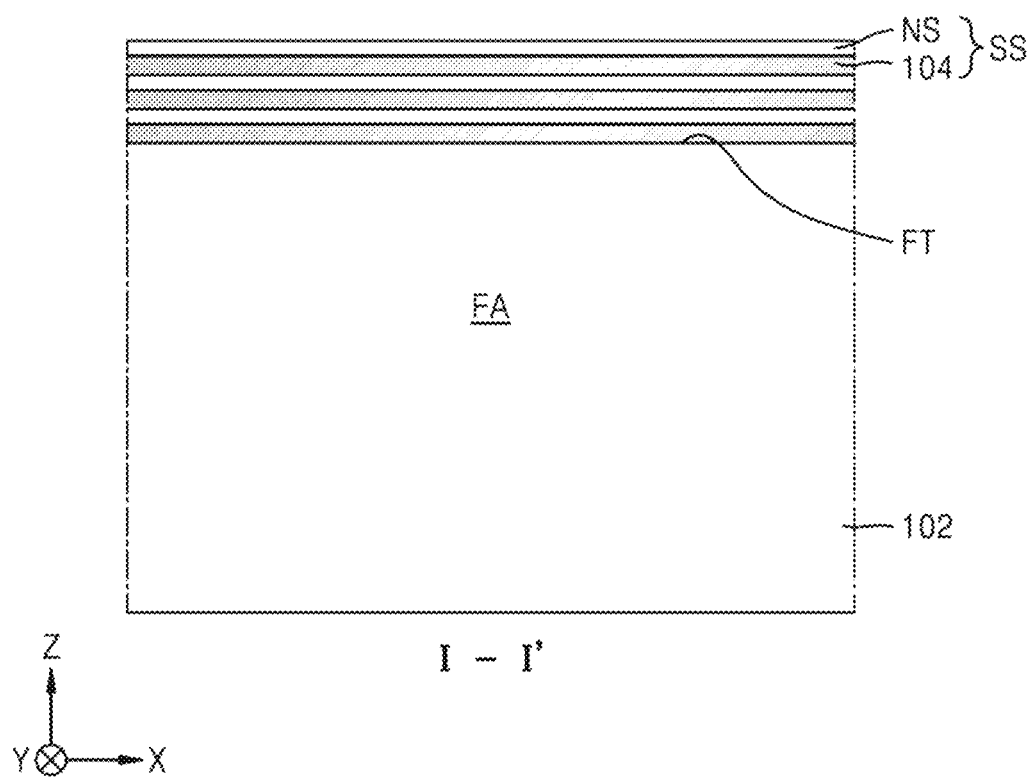
FIGS. 3A, 3B, 4A, 4B and 5 to 15 are cross-sectional views showing a process of manufacturing the semiconductor device of FIG. 1 before a removal poly gate (RPG) process in a method of manufacturing a semiconductor device according to an embodiment.
Figure 3B:
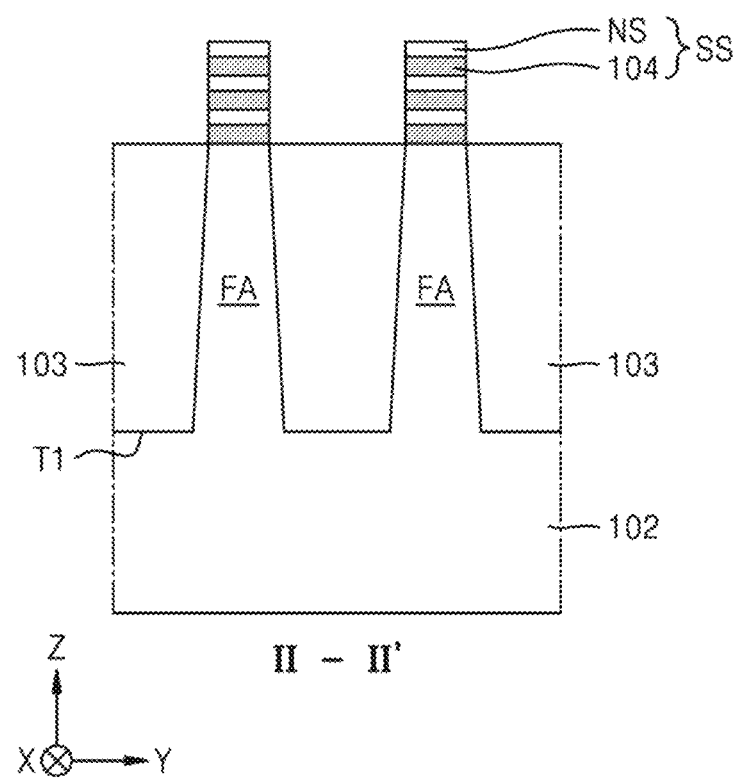

Referring to FIGS. 3A and 3B, in the method of manufacturing a semiconductor device, a stacked structure SS in which sacrificial semiconductor layers 104 and the nano-sheets NS are alternately stacked is formed on the substrate 102. Here, the substrate 102 may include a semiconductor material, such as silicon Si or Ge or a compound semiconductor material, such as SiGe, SiC, GaAs, InAs, or InP. However, the material constituting the substrate 102 is not limited to the above-stated materials. Also, an NMOS region and a PMOS region may be defined on the substrate 102. The NMOS region is a region where an NMOS transistor is formed and may include B ions as impurities in source/drain regions. Also, the PMOS region is a region where a PMOS transistor is formed and may include phosphorus (P) or arsenic (As) ions as impurities in source/drain regions.

A sacrificial semiconductor layer 104 and the nano-sheet NS may include different semiconductor materials. For example, the sacrificial semiconductor layer 104 may include SiGe, and the nano-sheet NS may include Si. The sacrificial semiconductor layers 104 may include the same material or may include different materials from one another. For example, the sacrificial semiconductor layers 104 may each include a SiGe layer, wherein the Ge content ratio of the sacrificial semiconductor layer 104 closest to the substrate 102 may be different from those of the other sacrificial semiconductor layers 104.

A mask pattern is formed on the stacked structure SS, and a trench T1 is formed by etching a portion of the stacked structure SS and a portion of the substrate 102 by using the mask pattern as an etch mask. The mask patterns may extend in the first direction (X direction) and may be spaced apart from one another in the second direction (Y direction). Through the formation of the trench T1, a plurality of fins FA defined by the trench T1 may be formed. A corresponding stacked structure SS may be disposed over each of the fins FA.

The device isolation layer 103 is formed by filling the trench T1 with an insulating material. The device isolation layer 103 may include, for example, a silicon oxide layer. The mask pattern is removed, and a portion of the upper portion of the device isolation layer 103 may be removed through a recess process. After the recess process, the top surface of the device isolation layer 103 may be substantially the same as or similar to top surfaces FT of the fins FA. A cross-sectional view of a portion corresponding to the line III-III' of FIG. 1 may show a structure in which the device isolation layer 103 on the substrate 102 are arranged.

Figure 4A:
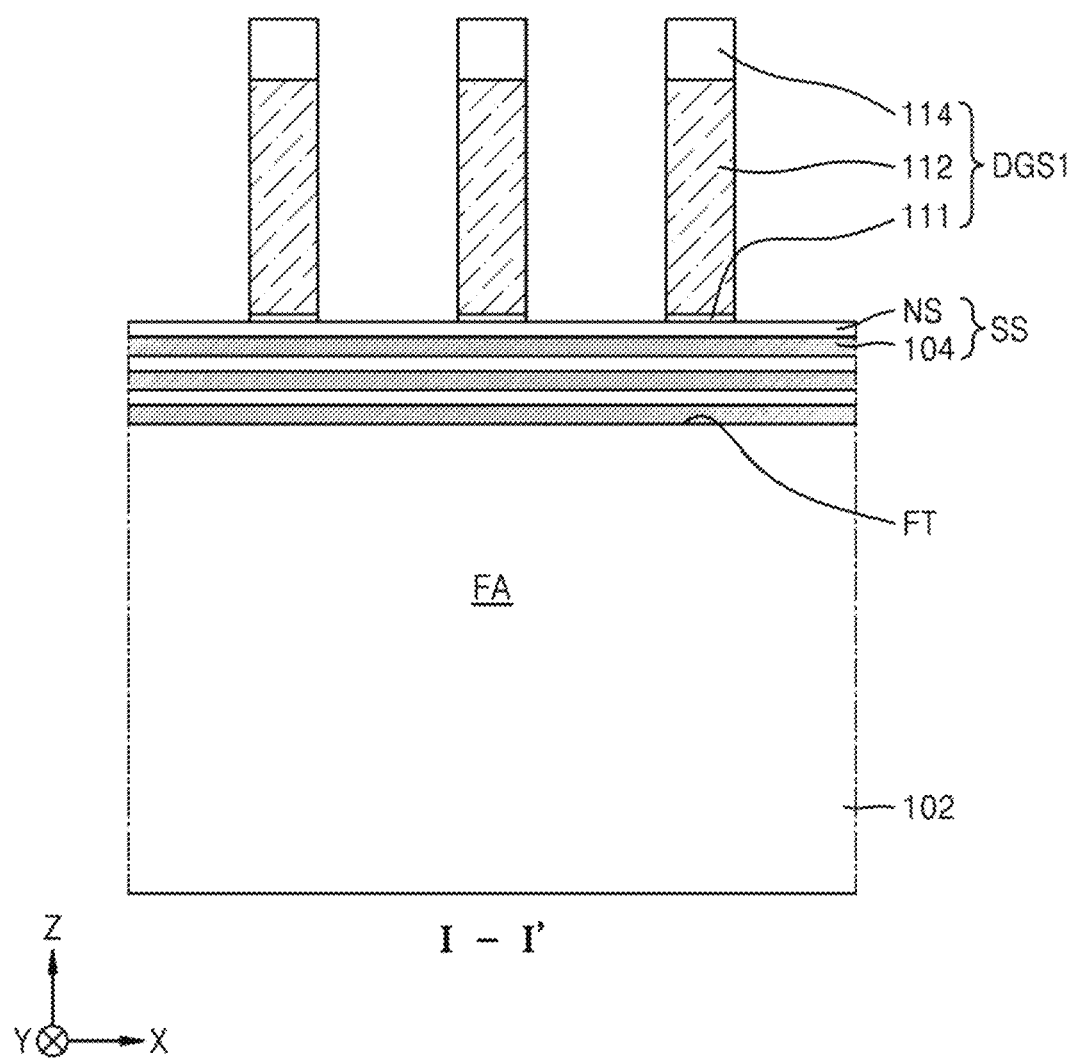
Figure 4B:
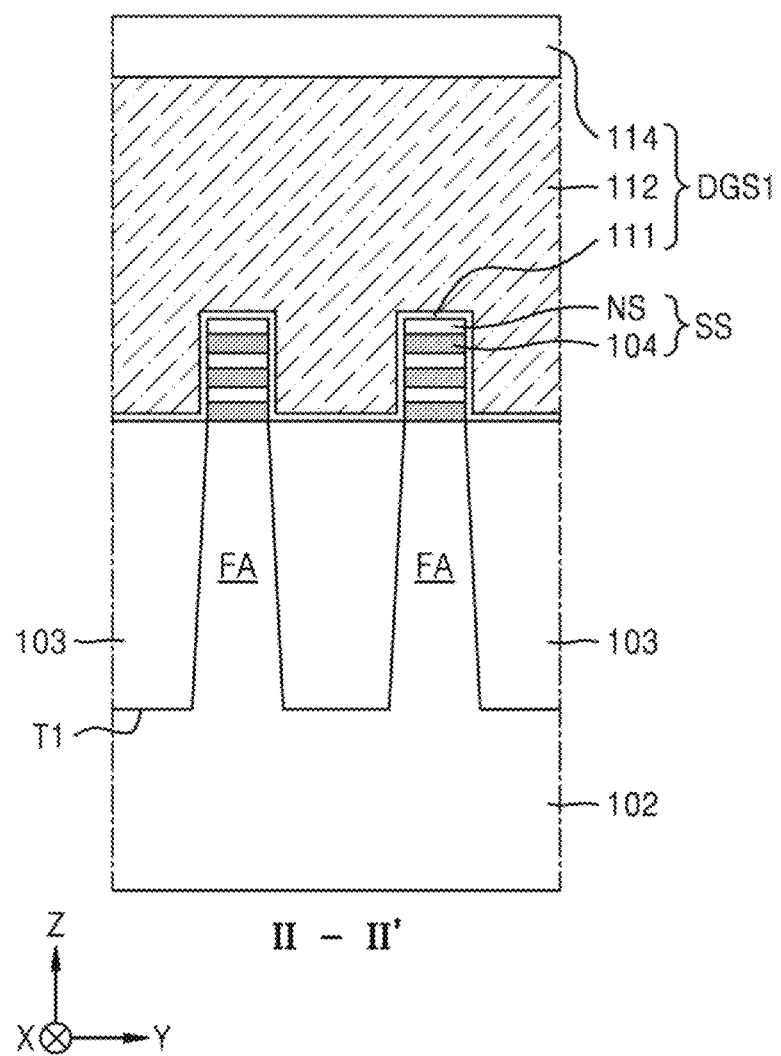

Referring to FIGS. 4A and 4B, a plurality of dummy gate structures DGS1 are formed on the fins FA on the substrate 102. The dummy gate structures DGS1 may extend across the fins FA and cover the top surface and side surfaces of a portion of the stacked structure SS. For example, the dummy gate structures DGS1 may extend in the second direction (Y direction) and may be spaced apart from one another in the first direction (X direction). A dummy gate structure DGS1 may include an insulation layer 111, a dummy gate 112, and a gate mask pattern 114. According to embodiments, the dummy gate 112 may include polysilicon, and the gate mask pattern 114 may include a silicon nitride layer. A cross-sectional view of a portion corresponding to the line III-III' of FIG. 1 may show a structure in which the dummy gate structure DGS1 is disposed on the device isolation layer 103.

Figure 5:
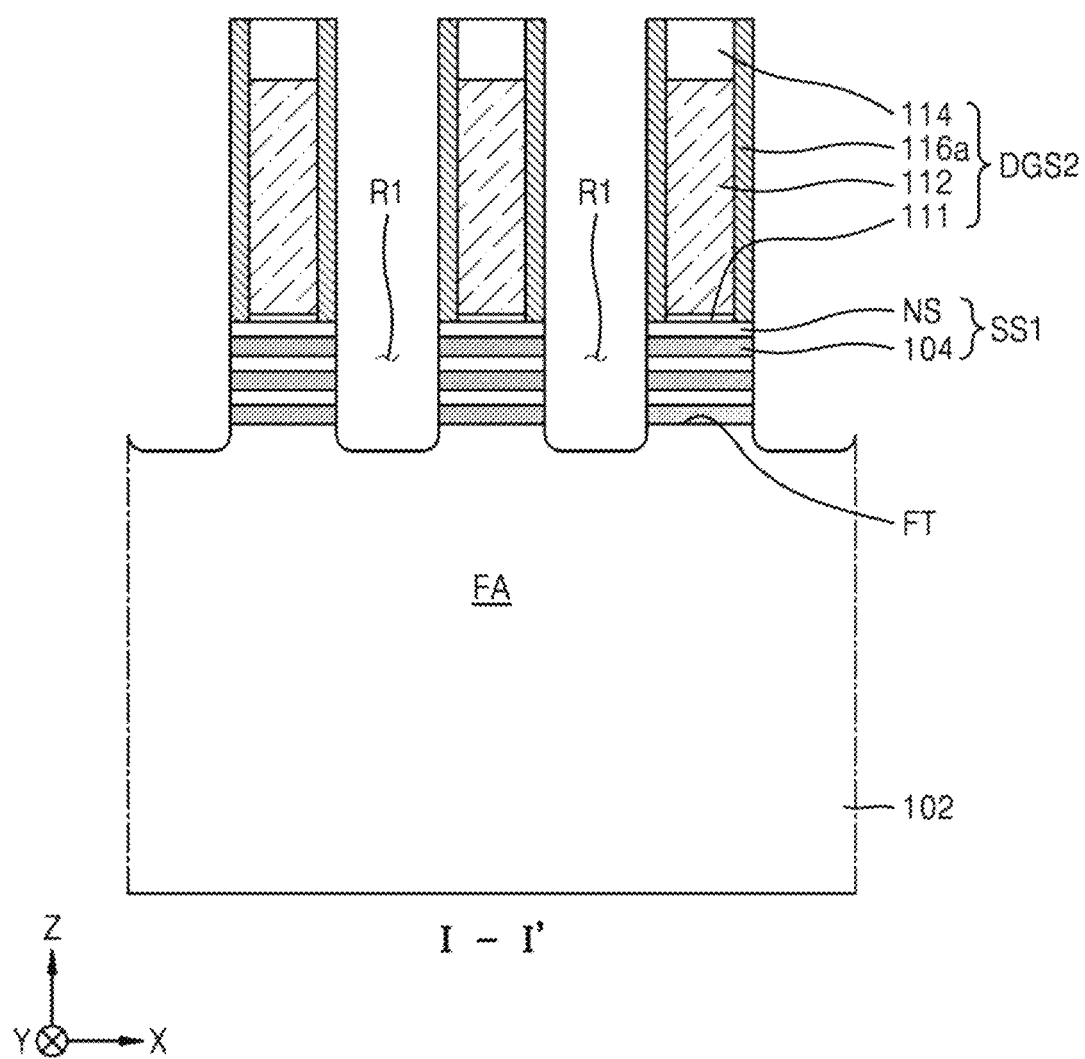

Referring to FIG. 5, first spacers 116a covering both sidewalls of the dummy gate structure DGS1 are formed. A first spacer 116a may include a single layer or multiple layers including SiN, SiCN, SiBN, SiON, SiOCN, SiBCN, SiOC, SiO$_2$, or a combination thereof. For example, in the method of manufacturing a semiconductor device, the first spacer 116a may include SiN$_x$. A dummy gate structure DGS2 may include the first spacer 116a. A portion of the stack structure SS is etched by using the dummy gate structure DGS2 as an etch mask, thereby opening the top surface of the fin FA. A first recess region R1 may be formed through the process of opening the top surface of the fin FA. A portion of the fin FA may be etched by using the dummy gate structure DGS2 as the etch mask. Thus, the level of the bottom surface of the first recess region R1 may be lower than the level of the top surface FT of the fin FA. Through the first recess region R1, the stack structure SS may be divided into a plurality of stack structures SS1.

A cross-sectional view of a portion corresponding to a line II-II' of FIG. 1 is substantially the same as FIG. 4B, and a cross-sectional view of a portion corresponding to the line III-III' of FIG. 1 may show a structure in which the dummy gate structure DGS2 is disposed on the device isolation layer 103. Hereinafter, in FIGS. 6 and 7, a cross-sectional view of a portion corresponding to the line II-II' of FIG. 1 and a cross-sectional view of a portion corresponding to the line III-III' of FIG. 1 may be substantially the same as the cross-sectional views described above.

Figure 6:
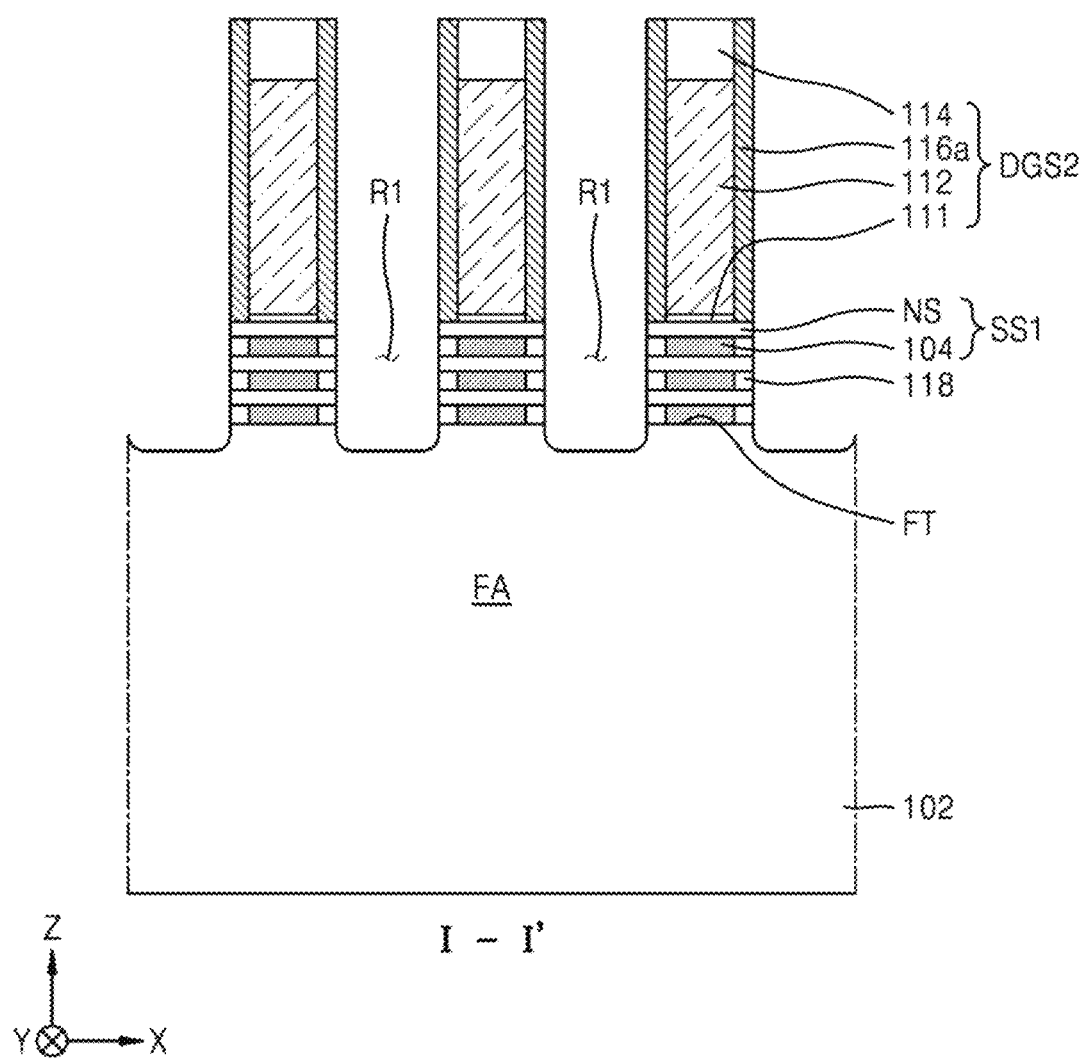

Referring to FIG. 6, the sacrificial semiconductor layers 104 opened at both sides of each of the stack structures SS1 are partially removed through an isotropic etching process, thereby forming recesses between the nano-sheets NS. In some embodiments, a difference in selectivity between the sacrificial semiconductor layer 104 and the nano-sheet NS may be used in the isotropic etching process for forming the recesses. The isotropic etching process may be performed as a wet etching process or a dry etching process. Insulation spacers 118 filling the recesses are formed. The insulation spacer 118 may be formed through an ALD process, a CVD process, an oxidation process, or a combination thereof.

Figure 7:
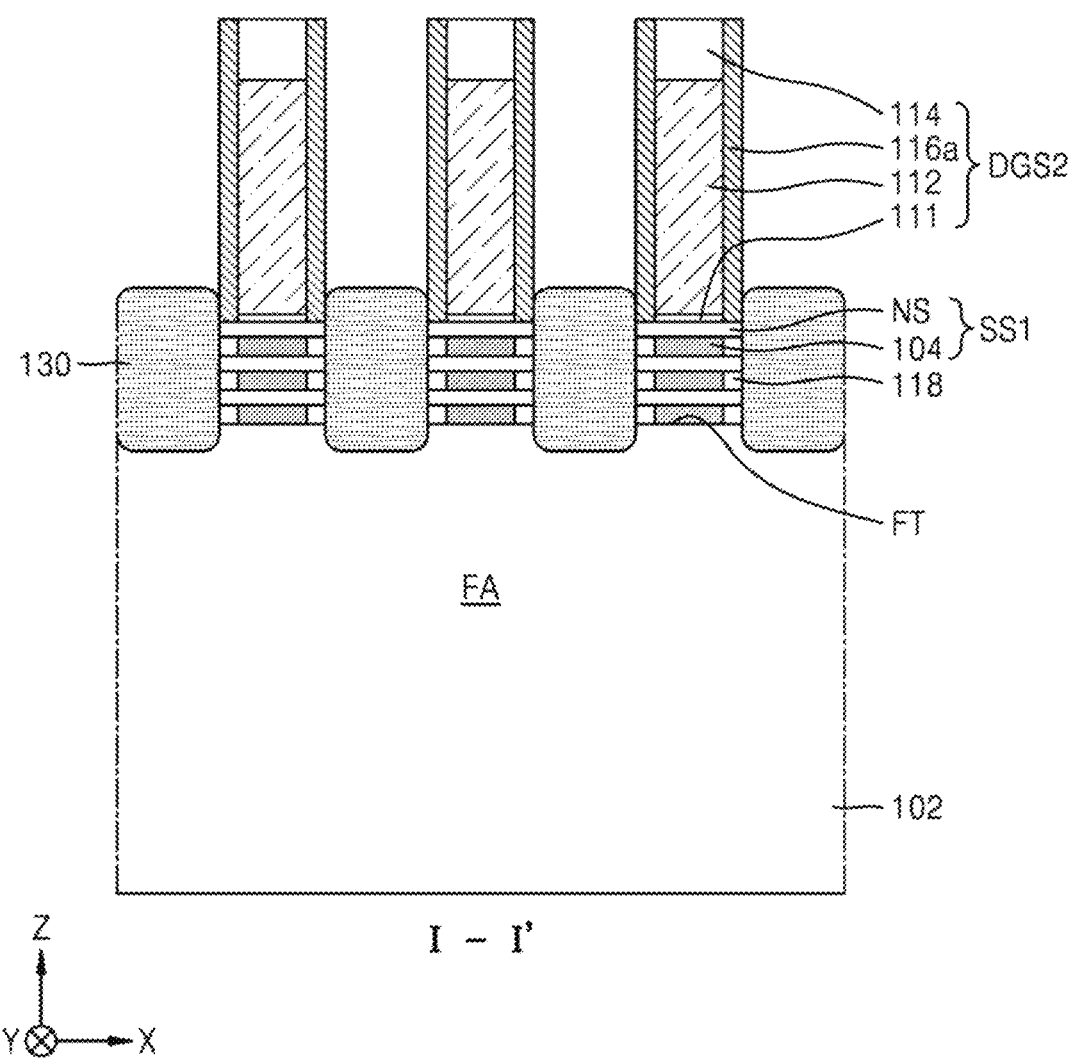

Referring to FIG. 7, a plurality of source/drain regions 130 are formed by epitaxially growing a semiconductor layer from both opened sidewalls of each of the nano-sheets NS and the opened surfaces of the fin FA. For example, when a region on the substrate 102 is an NMOS region, the source/drain region 130 may include B ions as an impurity. Also, when a region on the substrate 102 is a PMOS region, the source/drain region 130 may include P or As ions as an impurity.

Figure 8:
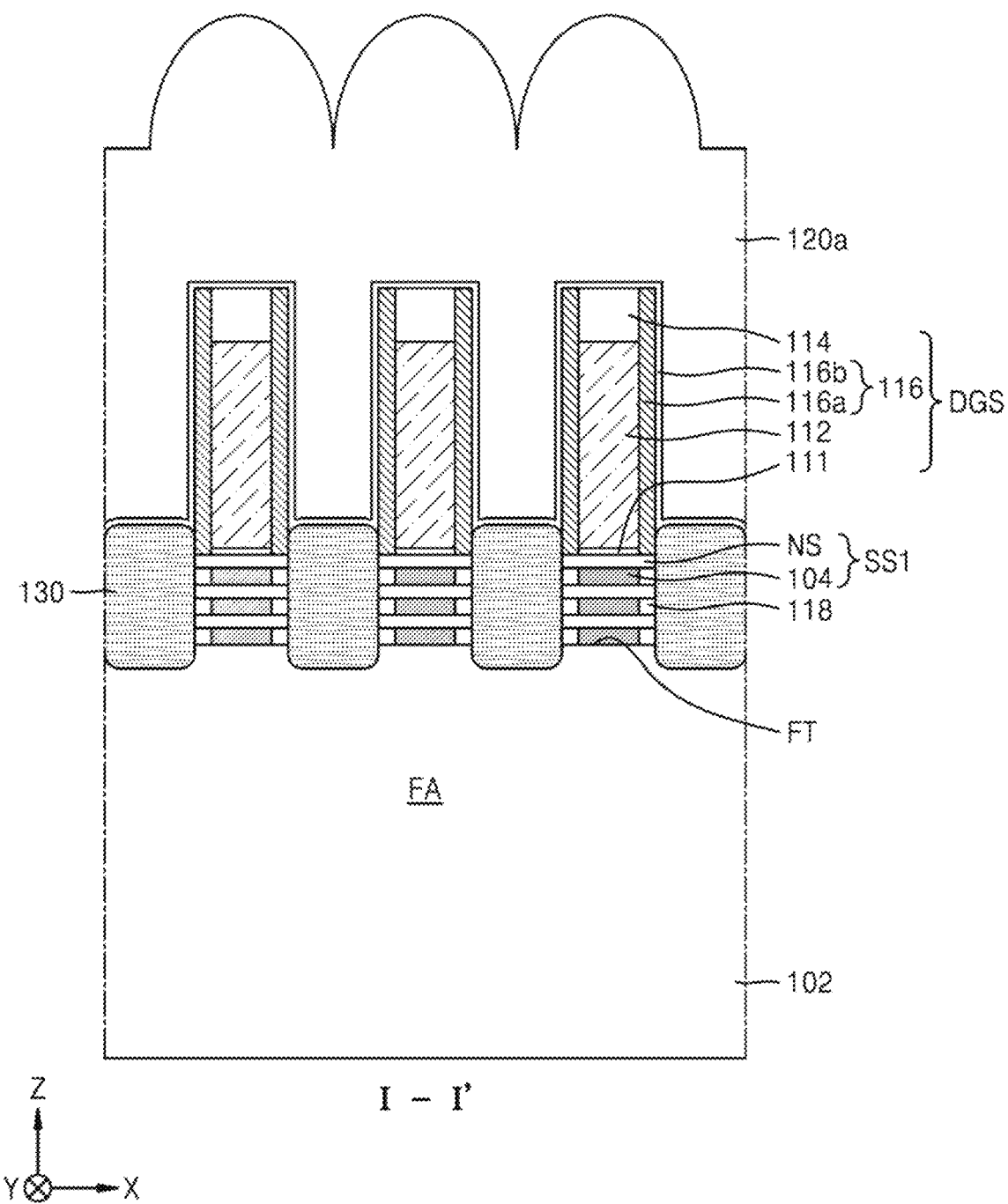

Referring to FIG. 8, a protective insulation layer 116b covering a resultant product in which the plurality of source/drain regions 130 are formed is formed, and an interlayer insulation layer 120a is formed on the protective insulation layer 116b. The dummy gate structure DGS may include the insulation layer 111, the dummy gate 112, the gate mask pattern 114, and the spacer 116. In the dummy gate structure DGS, the first spacer 116a and the protective insulation layer 116b may constitute the spacer 116. Also, as shown in FIG. 8, the protective insulation layer 116b may extend onto the source/drain region 130. Hereinafter, from FIG. 9, the first spacer 116a and the protective insulation layer 116b are shown as one spacer 116.

A cross-sectional view of a portion corresponding to the line II-II' in FIG. 1 may show a structure in which the interlayer insulation layer 120a is disposed on the gate mask pattern 114 in FIG. 4B, and a cross-sectional view of a portion corresponding to the line III-III' in FIG. 1 may show a structure in which the interlayer insulation layer 120a covering the dummy gate structure DGS is disposed on the device isolation layer 103.

Figure 9:
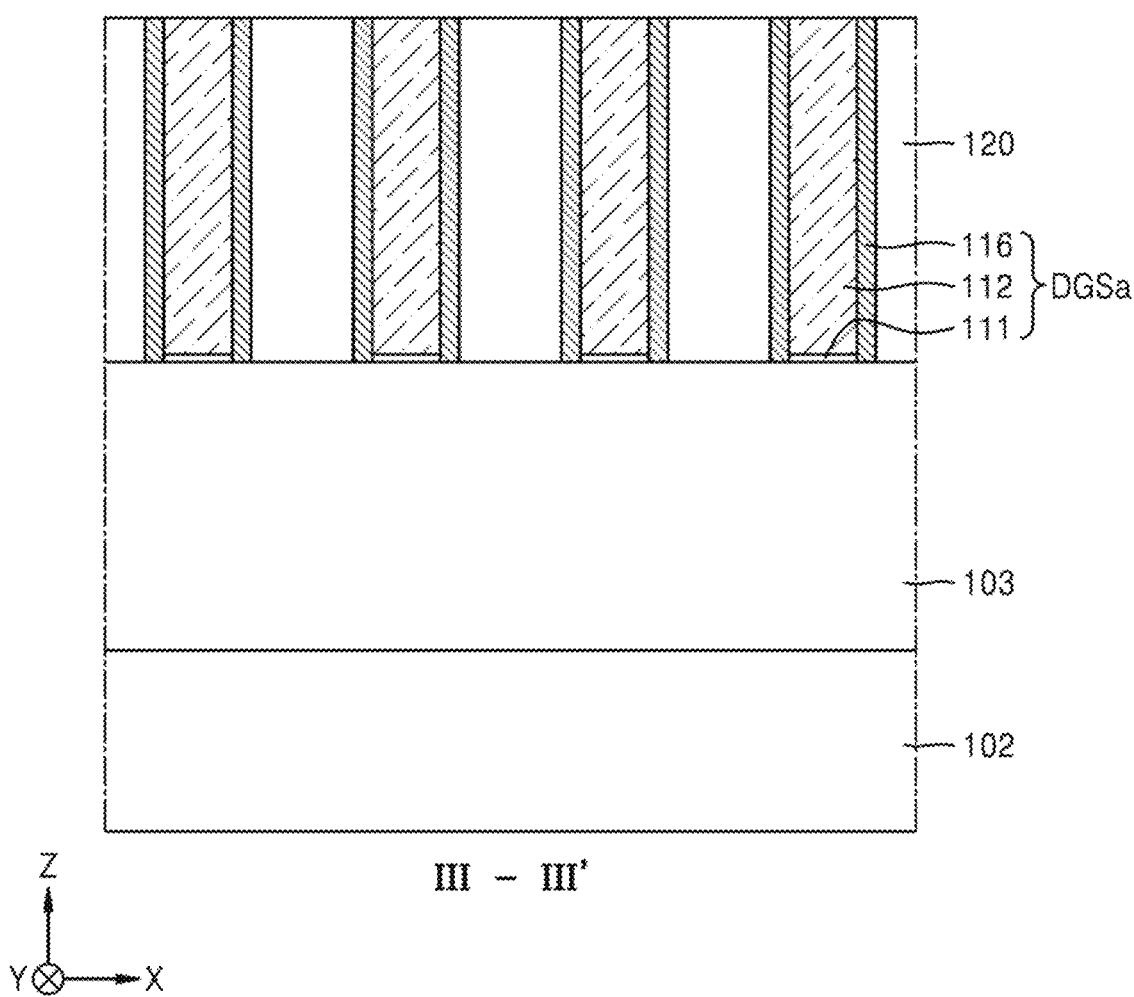

Referring to FIG. 9, the top surface of the dummy gate 112 is opened by removing the upper portion of the interlayer insulation layer 120a and the gate mask pattern 114 through a CMP process. After the CMP process, the top surface of the interlayer insulation layer 120, the top surface of the spacer 116, and the top surface of the dummy gate 112 may be substantially coplanar with one another. A dummy gate structure DGSa may include the insulation layer 111, the dummy gate 112, and the spacer 116.

Furthermore, a cross-sectional view of a portion corresponding to a line I-I' of FIG. 1 may have the substantially similar structure as that of a portion corresponding to a line III-III' of FIG. 1) except that the fins FA, the stack structures SS1, and the source/drain regions 130 are arranged instead of the device isolation layer 103 on the substrate 102 below the dummy gate structure DGSa and the interlayer insulation layer 120. Hereinafter, the same applies to FIGS. 10 to 15.

Figure 10:
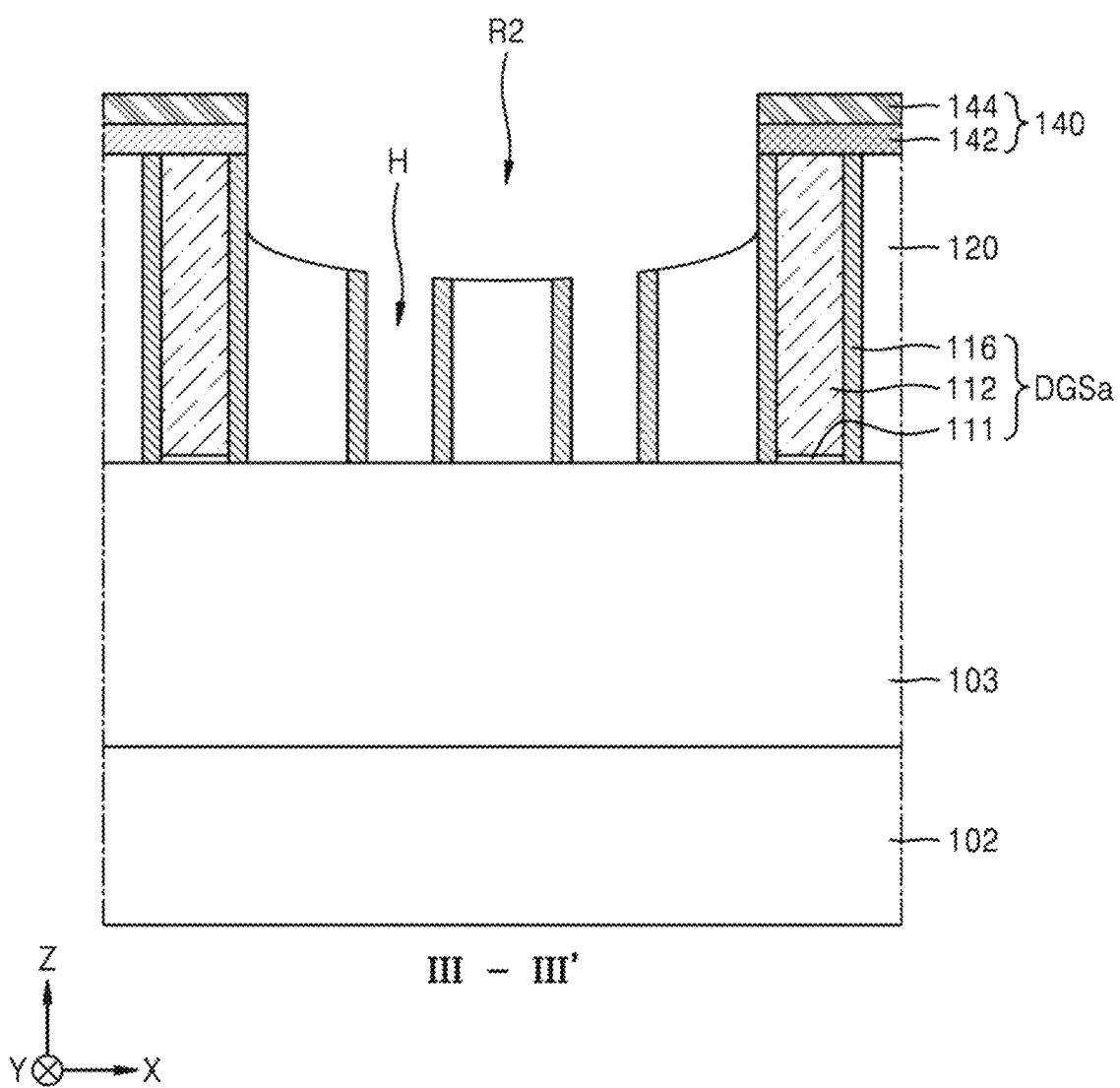

Referring to FIG. 10, a hard mask pattern 140 is formed on a resultant product on the substrate 102. The hard mask pattern 140 may have a shape that corresponds to the gate cut region CTar, as shown in FIG. 1. For example, the hard mask pattern 140 may define an opening that corresponds to the shape of the gate cut region CTar. For example, the opening may be a rectangle. The hard mask pattern 140 may include a lower nitride layer pattern 142 and an upper oxide layer pattern 144. For example, the nitride layer pattern 142 may include a silicon nitride layer, and the oxide layer pattern 144 may include TEOS. However, the materials constituting the nitride layer pattern 142 and the oxide layer pattern 144 are not limited to the above-stated materials. The hard mask pattern 140 may be implemented by forming a nitride layer and an oxide layer on the dummy gate structure DGSa and the interlayer insulation layer 120, and forming the nitride layer pattern 142 and the oxide layer pattern 144 by patterning the nitride layer and the oxide layer through a photo process.

The interlayer insulation layer 120 and the dummy gate 112 are etched by using the hard mask pattern 140 to form a second recess region R2. The second recess region R2 may be substantially the same as that of the gate cut region CTar in plan view. As shown in FIG. 10, upper portions of the interlayer insulation layer 120 and the spacers 116 may be removed through etching, and the dummy gate 112 may be completely removed. A hole H for opening the top surface of the device isolation layer 103 may be formed in the second recess region R2 by removing the dummy gate 112.

Figure 11:
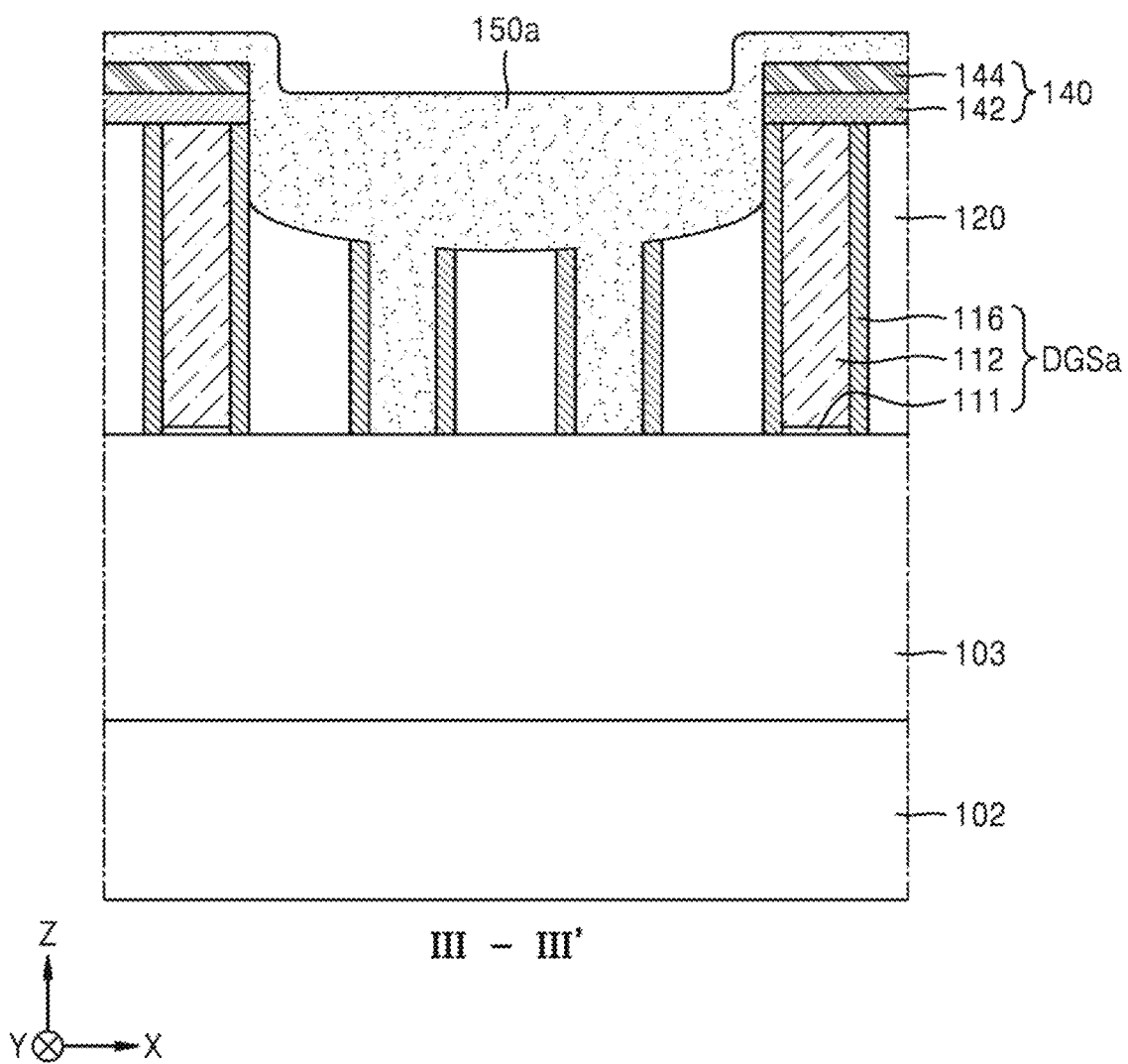

Referring to FIG. 11, the second recess region R2 is filled with a first nitride layer 150a. For example, the first nitride layer 150a may be a silicon nitride layer and may be formed through an ALD process. The first nitride layer 150a may fill the second recess region R2 and may also be formed on the hard mask pattern 140.

Figure 12:
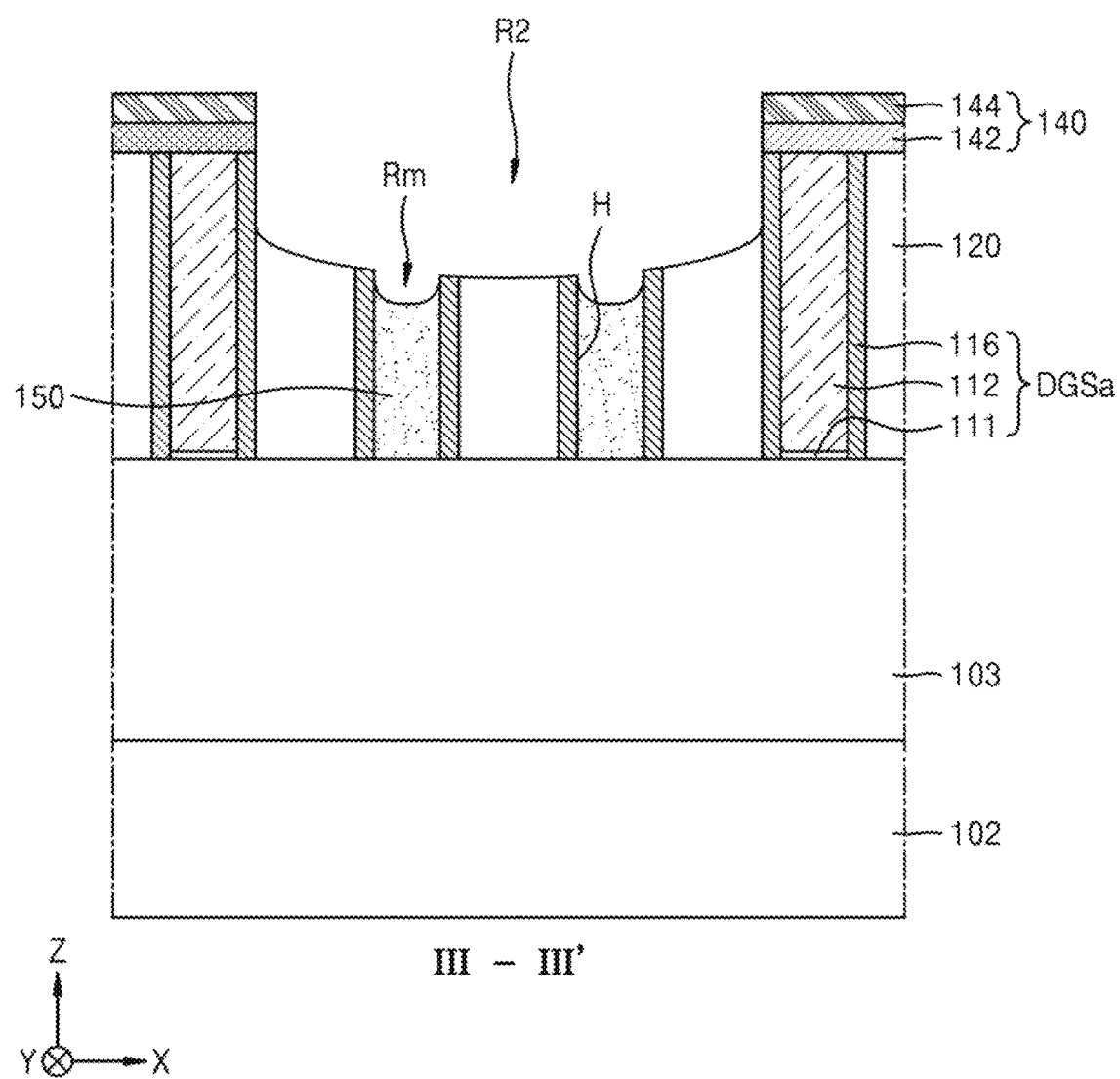

Referring to FIG. 12, after the first nitride layer 150a is formed, the upper portion of the first nitride layer 150a in the second recess region R2 and the first nitride layer 150a on the hard mask pattern 140 are removed through a chamfering process. Here, in general, the chamfering process may refer to a process of removing a portion of a material layer that interferes with a CMP process through wet etching, etch-back, etc.

In the method of manufacturing a semiconductor device, the upper portion of the first nitride layer 150a in the second recess region R2 may be removed through a chamfering process, thereby exposing the top surface of the interlayer insulation layer 120 in the second recess region R2. Also, through the chamfering process, the first nitride layer 150 may be maintained only in the hole H. As shown in FIG. 12, a fine recess Rm may be formed in the upper portion of the first nitride layer 150 in the hole H.

For reference, a process in which, although the upper portion of a first nitride layer in the second recess region R2 is removed through a chamfering process, the first nitride layer having a certain thickness remains on the interlayer insulation layer 120 is provided as a comparative example. In this case, in a later process of forming the source/drain contact 180 by etching the lower interlayer insulation layer 120, the first nitride layer remaining on the interlayer insulation layer 120 may acts as an etch-interfering factor, thereby causing a defect in the source/drain contact 180. On the other hand, in the method of manufacturing a semiconductor device according to embodiments, because the top surface of the interlayer insulation layer 120 of the second recess region R2 is completely opened in the chamfering process, a defect in a later process of forming the source/drain contact 180 may be prevented in advance, and thus a reliable semiconductor device may be manufactured. Here, in the process of manufacturing a semiconductor device according to embodiments, to completely remove a portion of the first nitride layer 150a on the interlayer insulation layer 120, the time of a chamfering process may be increased.

Figure 13:
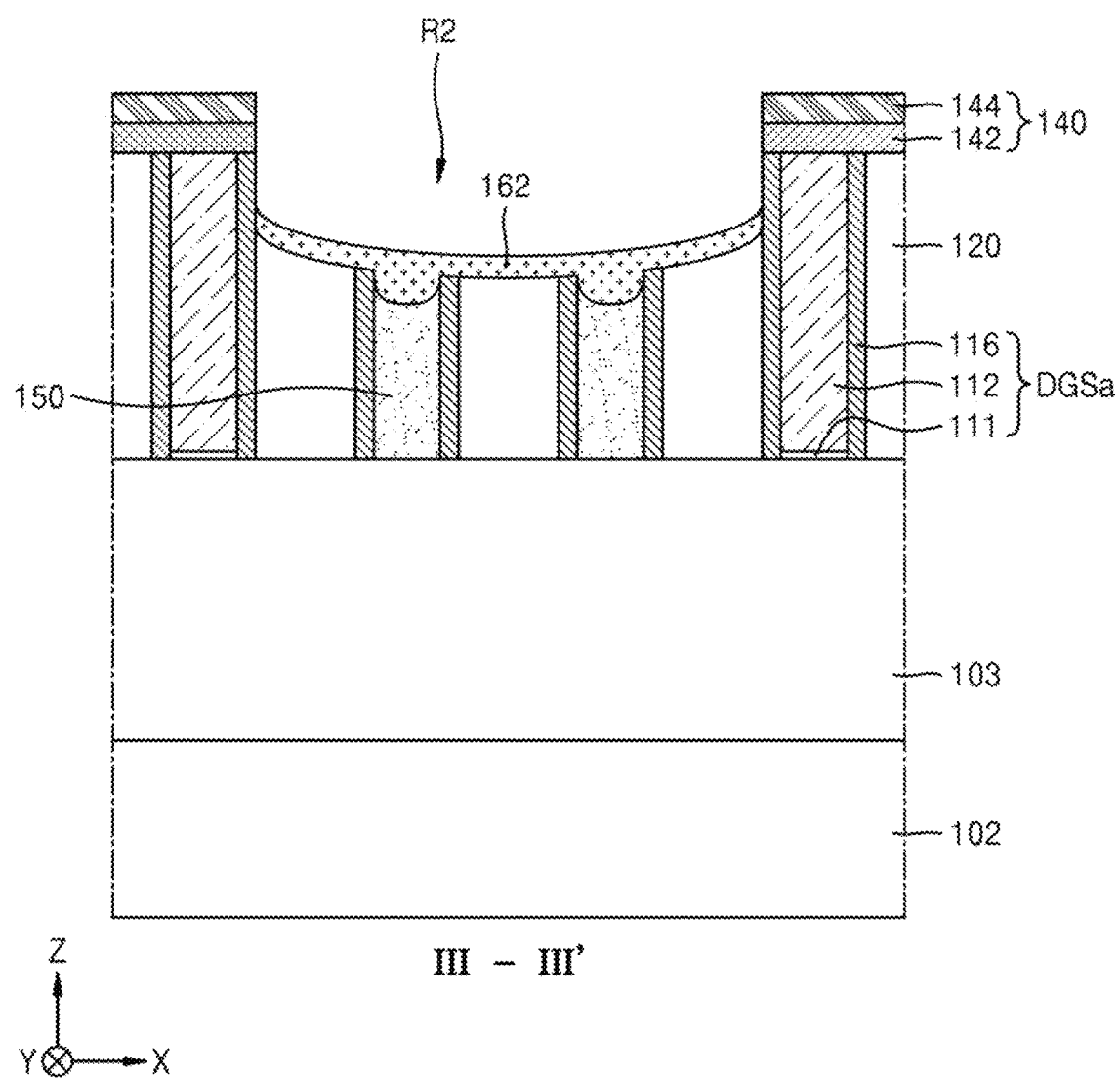

Referring to FIG. 13, the buffer layer 162 covering the interlayer insulation layer 120, the first nitride layer 150, and the spacer 116 is formed in the second recess region R2. The buffer layer 162 may fill the fine recess Rm in the hole H. The buffer layer 162 may include an oxide layer. For example, the buffer layer 162 may include a silicon oxide layer. However, the material constituting the buffer layer 162 is not limited thereto. According to some embodiments, the buffer layer 162 may be omitted.

Here, the buffer layer 162 may serve to improve adhesion between the first nitride layer 150 and the upper oxide layer 164 on the buffer layer 162. For example, when the first nitride layer 150 includes a hydrophobic silicon nitride layer and the upper oxide layer 164 includes hydrophilic TOSZ, the buffer layer 162 may include a hydrophilic silicon oxide layer, thereby improving adhesion between the first nitride layer 150 and the upper oxide layer 164. Also, the buffer layer 162 may relieve stress generated during shrinkage due to annealing of the upper oxide layer 164.

Figure 14:
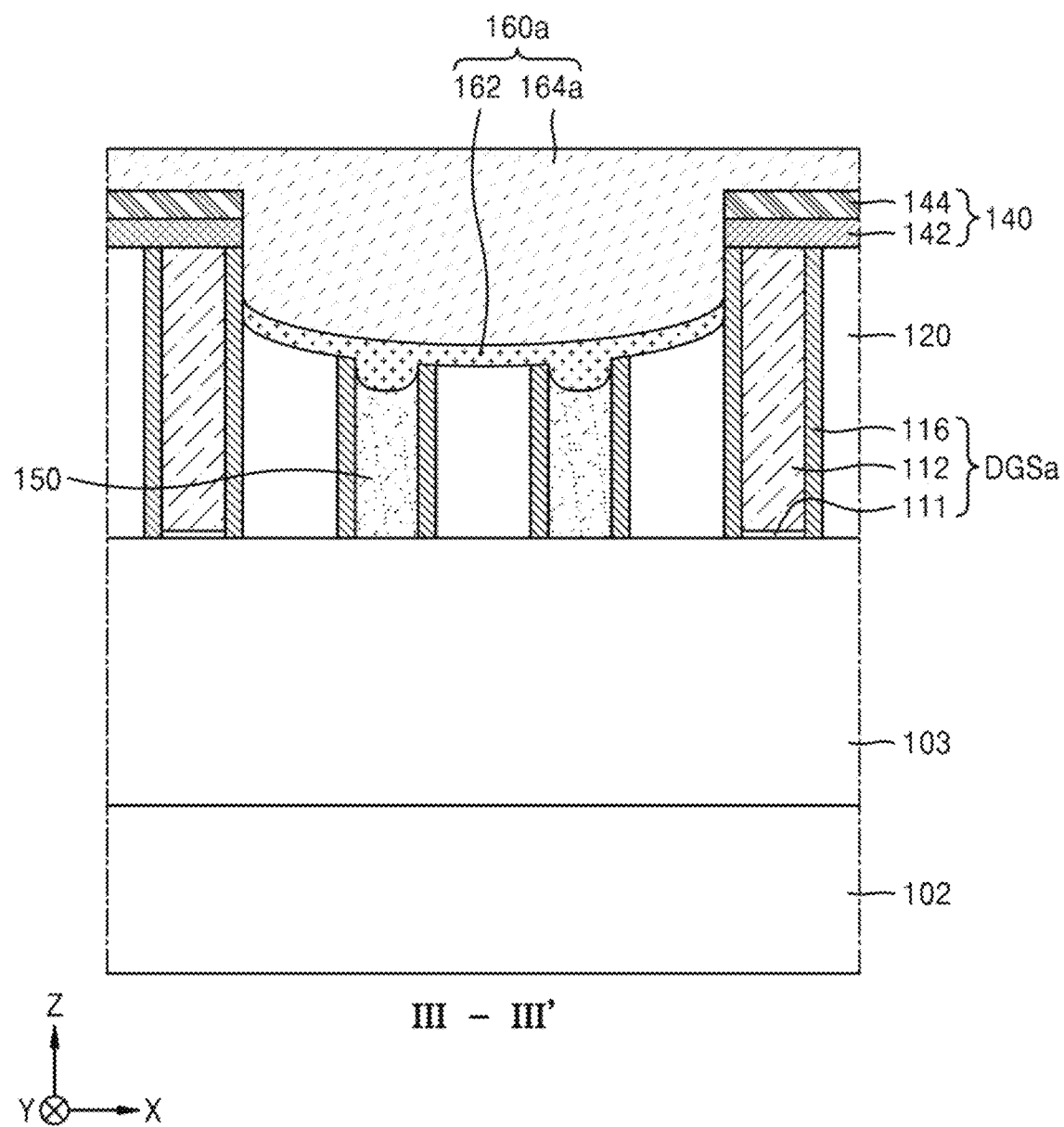

Referring to FIG. 14, subsequently, an upper oxide layer 164a filling the second recess region R2 is formed. The upper oxide layer 164a may be formed on the buffer layer 162 in the second recess region R2 and may also be formed on the hard mask pattern 140. The upper oxide layer 164a may include substantially the same material as the interlayer insulation layer 120. For example, the upper oxide layer 164a may include TOSZ. However, the material constituting the upper oxide layer 164a is not limited to TOSZ. The buffer layer 162 and the upper oxide layer 164a may constitute a buried oxide layer 160a.

Here, for comparison, a process in which, in a second recess region, a first nitride layer is maintained to a certain thickness on the interlayer insulation layer 120 and the upper oxide layer 164a is formed on the first nitride layer is provided as a comparative example. In this case, the first nitride layer and the upper oxide layer 164a may be arranged on the interlayer insulation layer 120. On the other hand, in the method of manufacturing a semiconductor device, the buffer layer 162 and the upper oxide layer 164a may be arranged on the interlayer insulation layer 120 or the upper oxide layer 164a may be disposed directly on the interlayer insulation layer 120.

Figure 15:
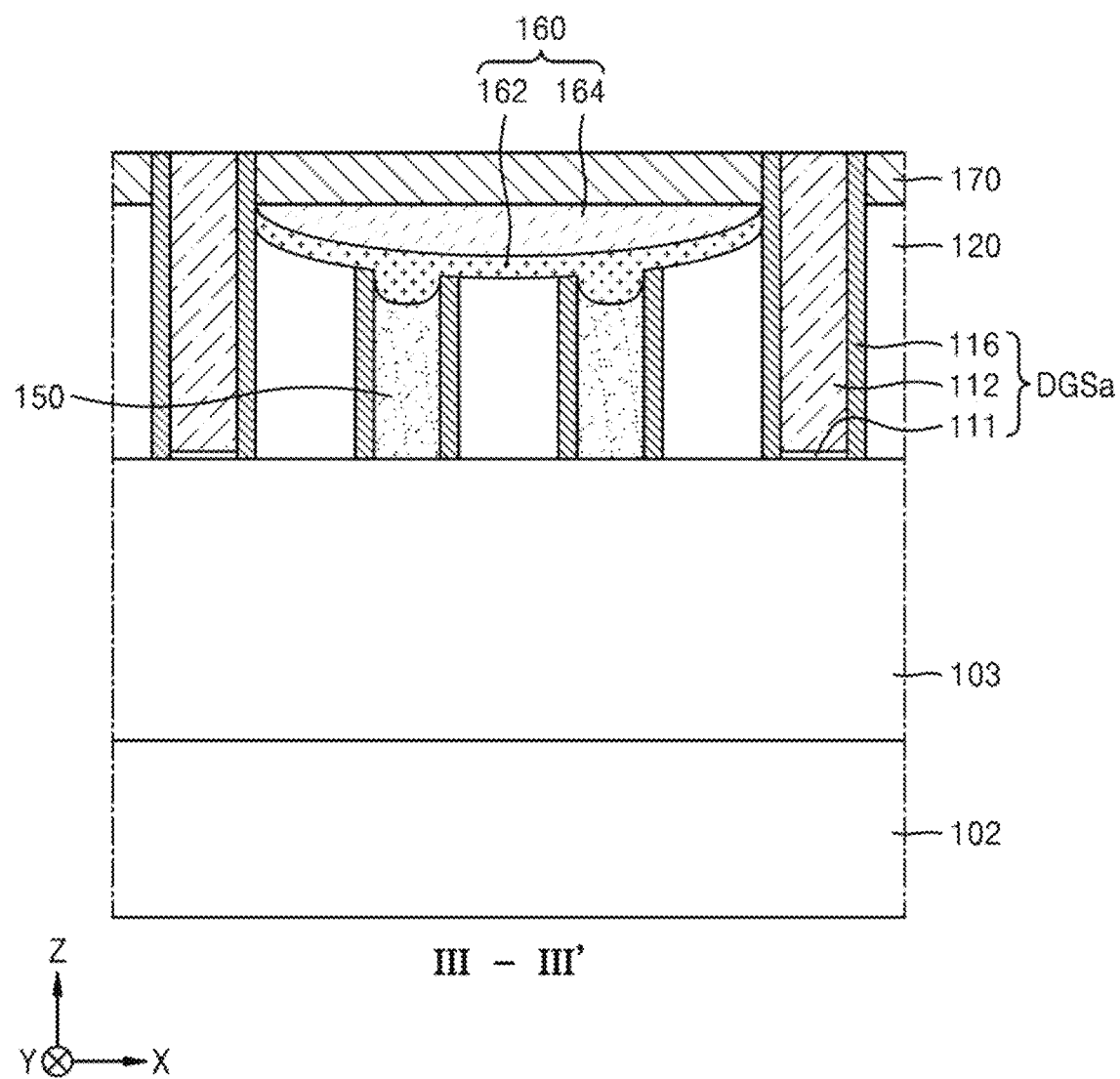

Referring to FIG. 15, after the upper oxide layer 164a is formed, the upper portion of the upper oxide layer 164a and the hard mask pattern 140 are removed through a CMP process, thereby opening the top surface of the dummy gate 112. Therefore, the top surface of the dummy gate 112 may become substantially coplanar with the top surface of the interlayer insulation layer 120 between dummy gates 112 and the top surface of the upper oxide layer 164 in the second recess region R2.

Subsequently, upper portions of the interlayer insulation layer 120 and the upper oxide layer 164 are removed to form a recess. The recess may be formed through a wet etching or a dry etching by using a difference in selectivity between the oxide layer and the nitride layer. Thereafter, the recess is filled with a second nitride layer 170. The second nitride layer 170 may include, for example, a silicon nitride layer. As the second nitride layer 170 is formed, the buried oxide layer 160 and the second nitride layer 170 may be arranged on the interlayer insulation layer 120 in the second recess region R2. Also, in the second recess region R2, the buried oxide layer 160 and the second nitride layer 170 may be arranged on the first nitride layer 150.

For reference, in the case of the method of manufacturing a semiconductor device according to the above-stated comparative example, after a CMP process, the first nitride layer may be maintained in the second recess region R2 and there may be no upper oxide layer. Therefore, no separate recess is formed in the second recess region R2, and the second nitride layer 170 may not be formed.

Figure 16A:
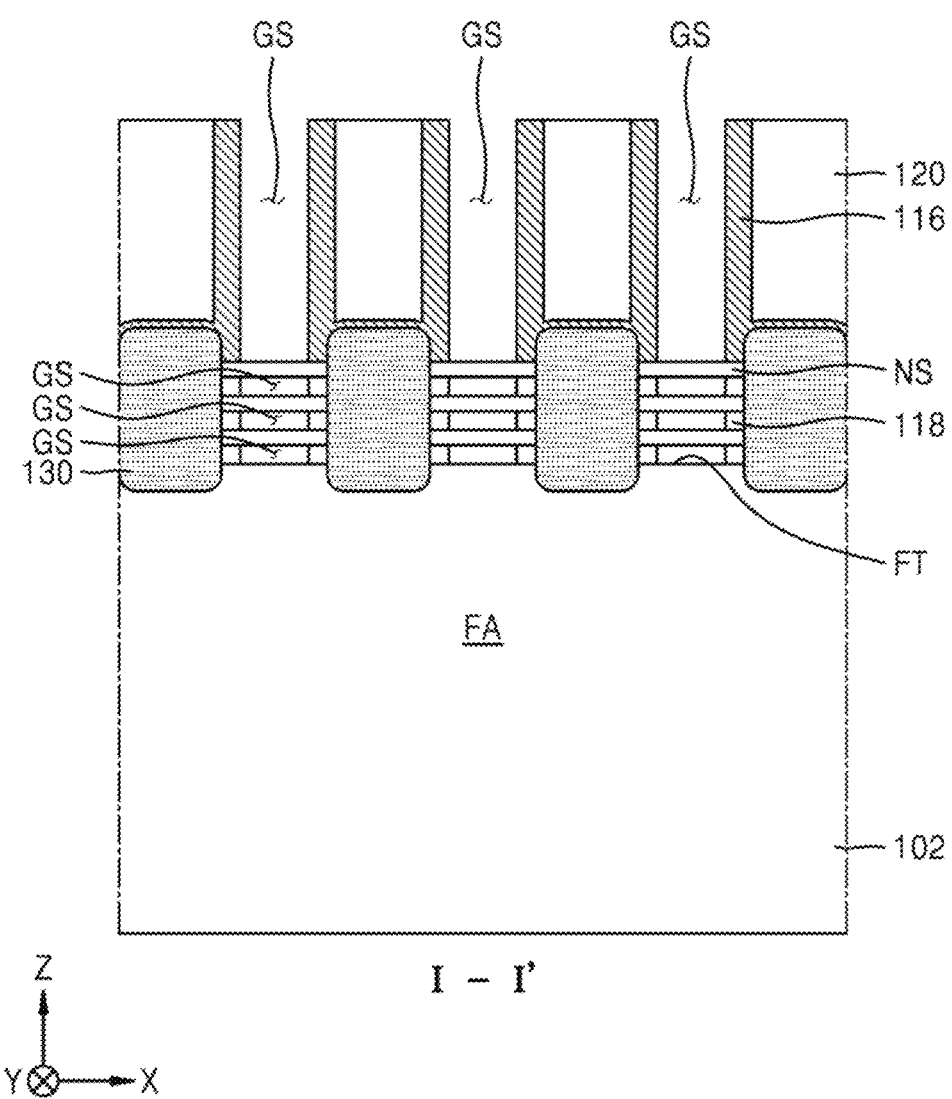
FIGS. 16A and 16B are cross-sectional views showing an RPG process in a method of manufacturing a semiconductor device according to an embodiment.
Figure 16B:
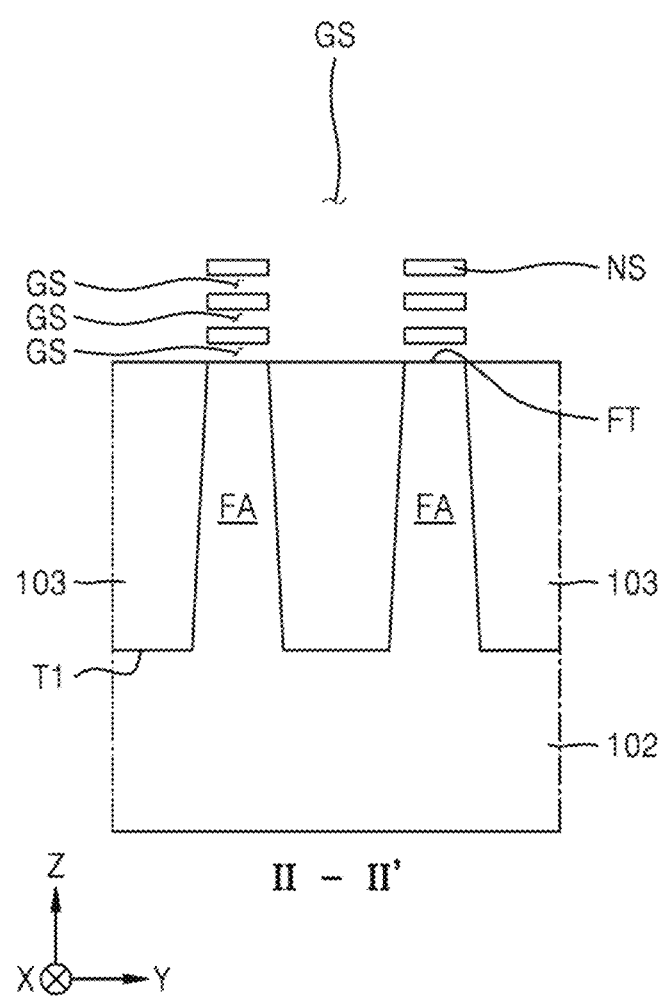

FIGS. 16A and 16B are cross-sectional views showing an RPG process in a method of manufacturing a semiconductor device according to an embodiment.

Referring to FIGS. 16A and 16B, after the second nitride layer 170 is formed, an RPG process is performed. The RPG process may refer to a process of removing the dummy gate 112 including polysilicon. A gate space GS is formed by removing the dummy gate 112 and the insulation layer 111 thereunder through the RPG process. The nano-sheet NS may be opened through the gate space GS. For example, the gate space GS may be formed in the upper portion of the nano-sheet NS, between the nano-sheets NS, and between the fin FA and the nano-sheet, as shown in FIG. 16B.

Figure 17A:
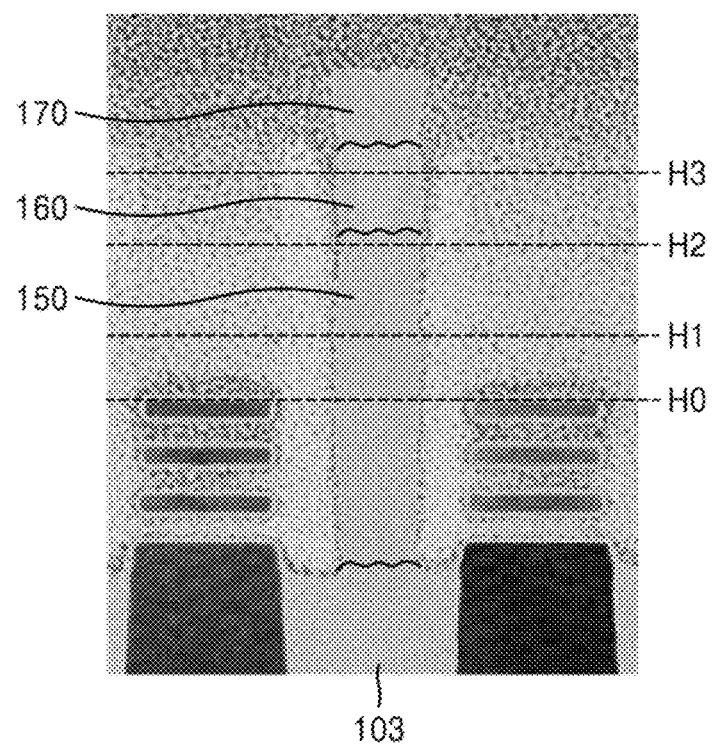
FIGS. 17A and 17B are a scanning electron microscope (SEM) image of a cross-section of a semiconductor device in the state of FIG. 16B and a SEM photograph of a semiconductor device of a comparative example, respectively.
Figure 17B:
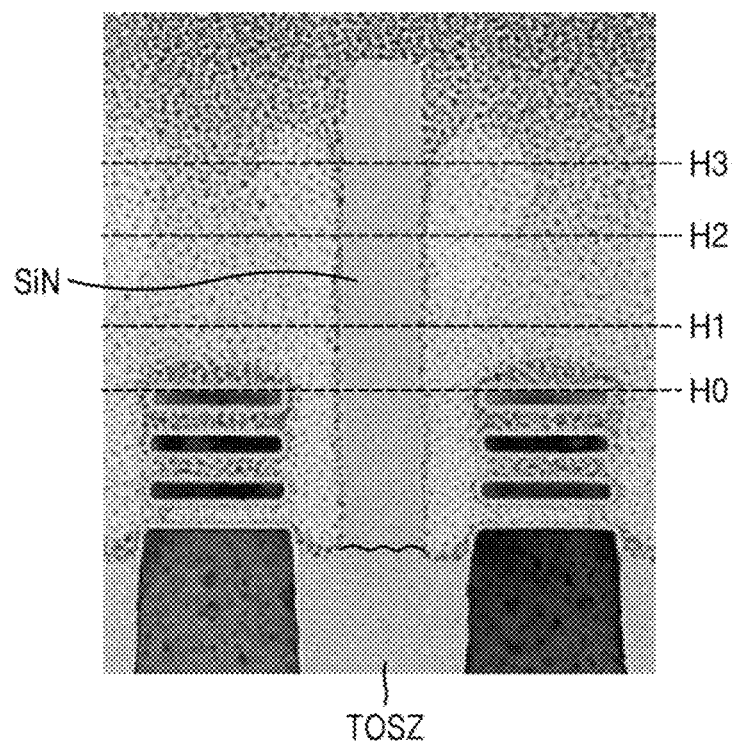

FIGS. 17A and 17B are an SEM image of a cross-section of a semiconductor device in the state of FIG. 16B and a SEM photograph of a semiconductor device of a comparative example, respectively, and correspond to cross-sectional views of gate structures passing through gate cut regions.

Referring to FIGS. 17A and 17B, in the method of manufacturing a semiconductor device, in the second recess region R2, the first nitride layer 150, the buried oxide layer 160, and the second nitride layer 170 may be sequentially stacked on the device isolation layer 103. On the other hand, in the case of the above-stated comparative example, only a nitride layer corresponding to the first nitride layer 150 may be disposed on the device isolation layer 103.

In FIGS. 17A and 17B, H0 may correspond to the top surface of the uppermost nano-sheet NS, and H1 may correspond to the height of the top surface of the metal gate 110. Also, H2 may correspond to the height of the top surface of the source/drain contact 180 or a gate contact. H3 may correspond to the height of the top surface of a self-aligning contact. In the final structure of a semiconductor device, when H2 is maintained, the buried oxide layer 160 may be removed through a CMP process. According to some embodiments, in the final structure of the semiconductor device, a portion of the buried oxide layer 160 (e.g., a portion of the buffer layer 162 or the buffer layer 162 and a portion of the upper oxide layer 164) may be maintained.

Figure 18A:
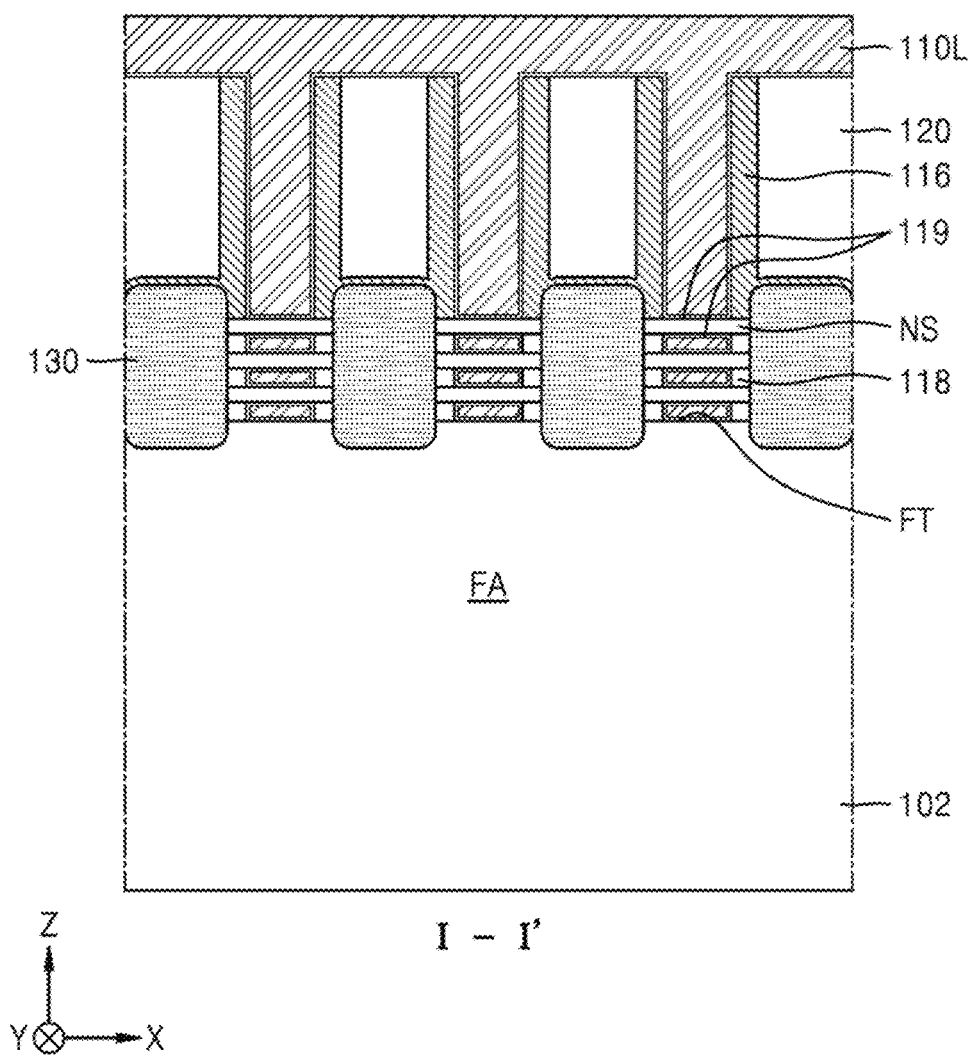
FIGS. 18A, 18B, 19A, 19B and 19C are cross-sectional views of a process of manufacturing the semiconductor device of FIG. 1 after an RPG process in a method of manufacturing a semiconductor device according to an embodiment.
Figure 18B:
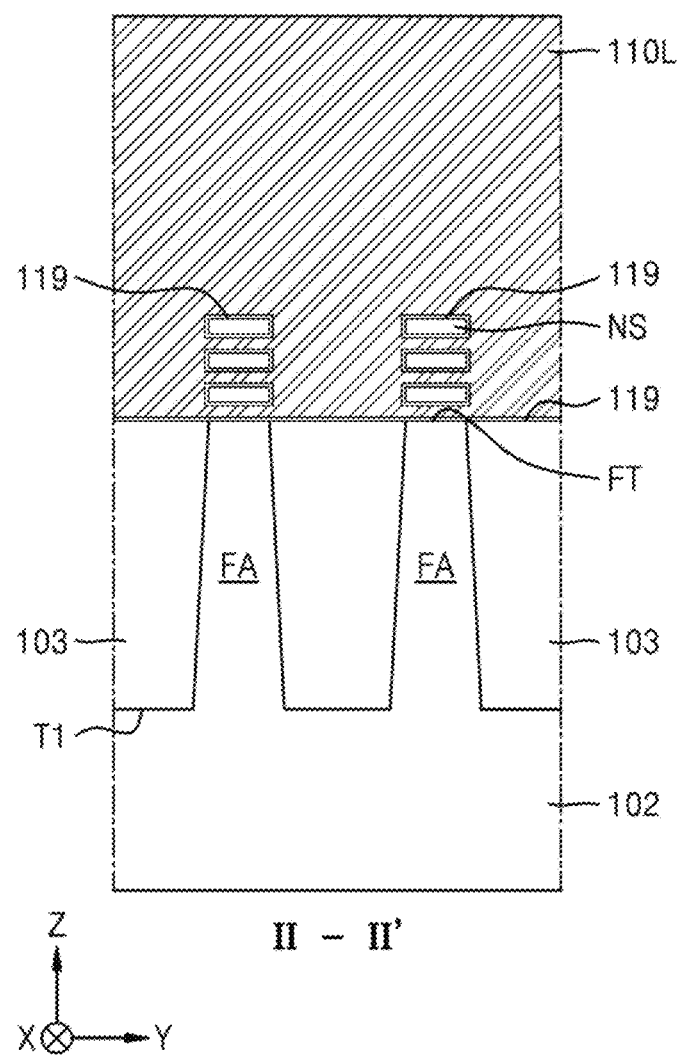
Figure 19A:
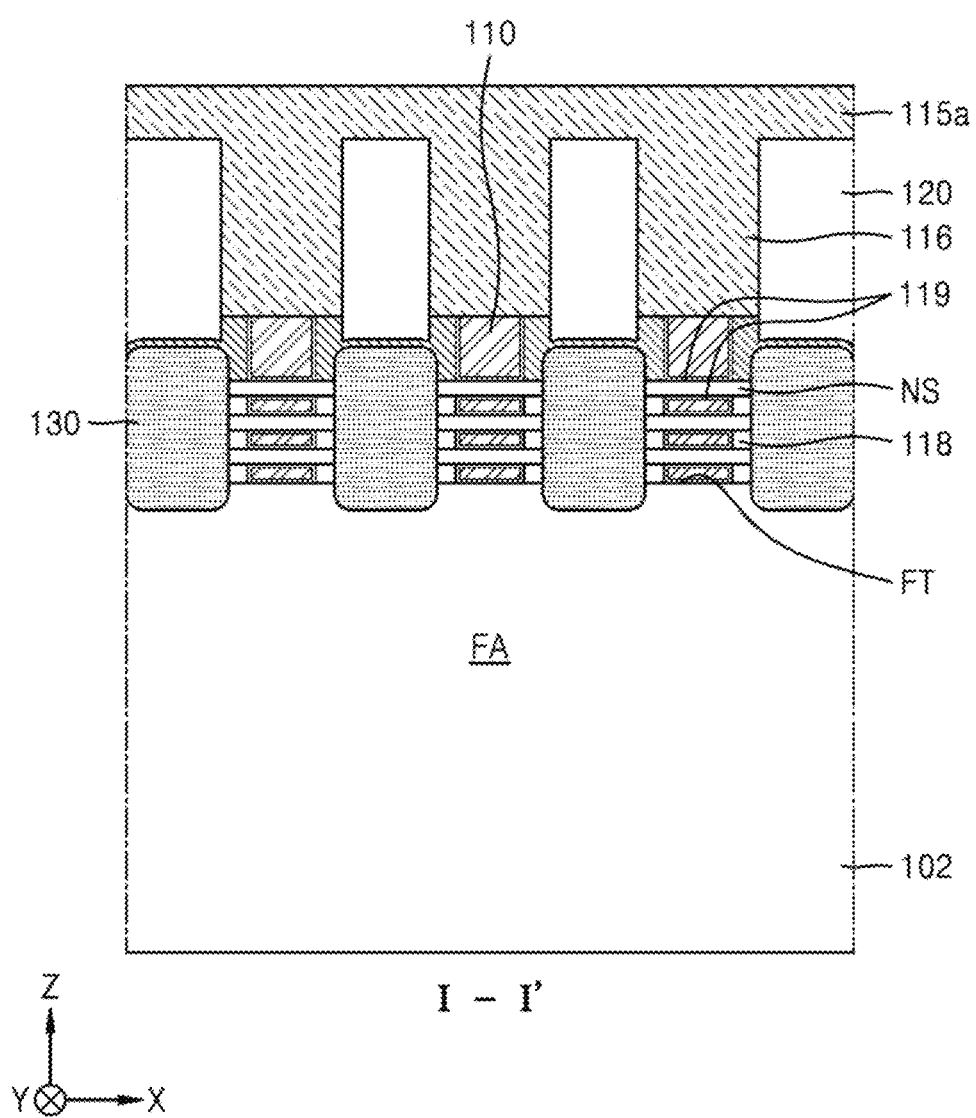
Figure 19B:
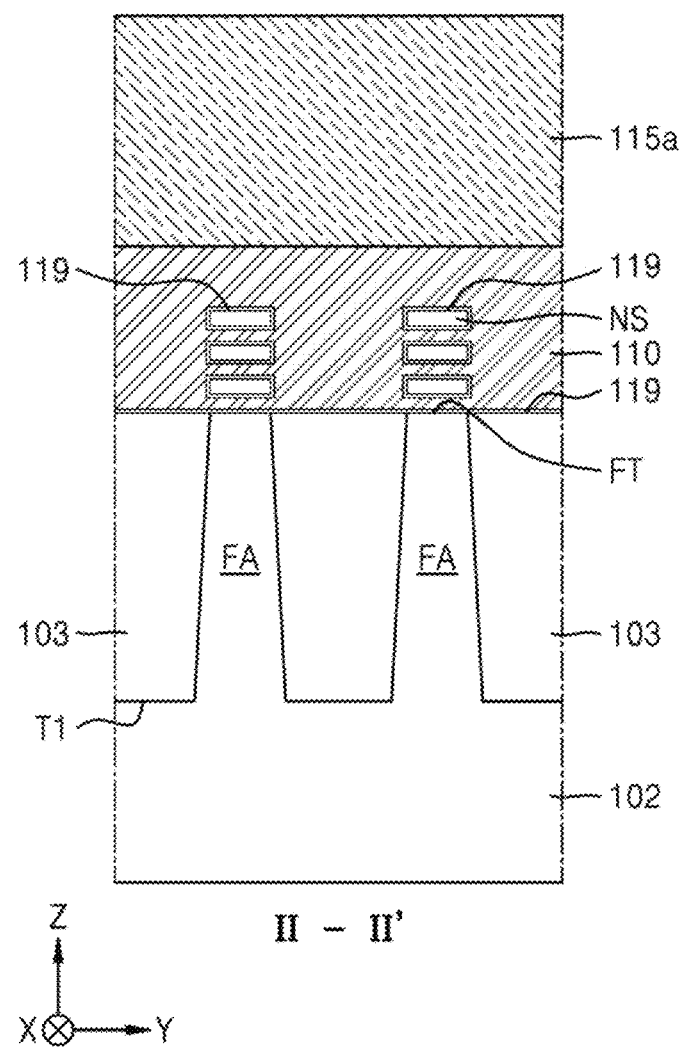
Figure 19C:
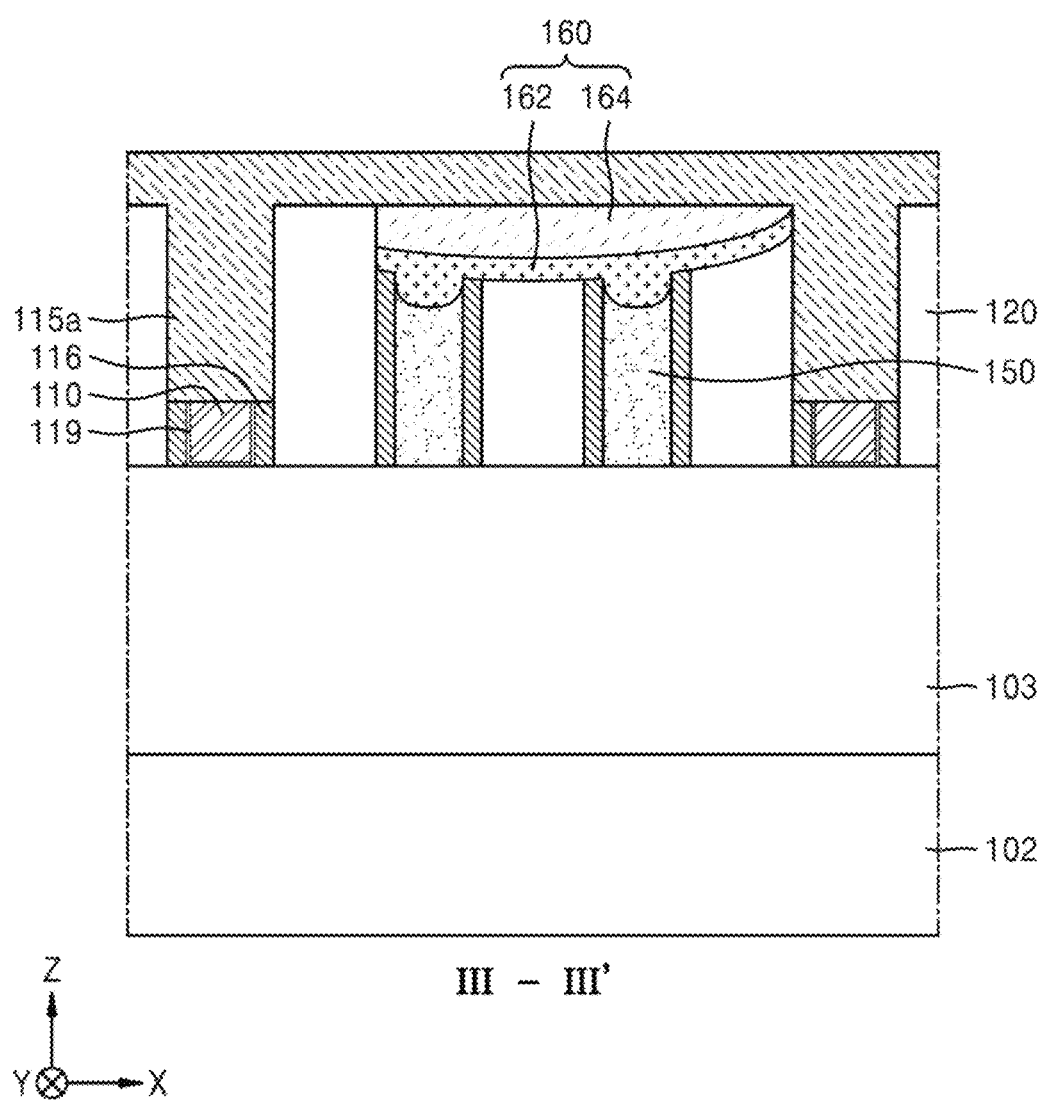

FIGS. 18A to 19C are cross-sectional views of a process of manufacturing the semiconductor device of FIG. 1 after an RPG process in a method of manufacturing a semiconductor device according to an embodiment. FIGS. 18A to 19B are cross-sectional views taken along lines I-I' and II-II' of FIG. 1, and FIG. 19C is a cross-sectional view taken along the line III-III' of FIG. 1.

Referring to FIGS. 18A and 18B, the gate insulation layer 119 covering opened surfaces of the nano-sheet NS and the fin FA is formed. The gate insulation layer 119 may be formed through an ALD process.

A metal gate conductive layer 110L is formed on the gate insulation layer 119. The metal gate conductive layer 110L may cover the top surface of the interlayer insulation layer 120 and fill the gate space GS. The metal gate conductive layer 110L may include a metal, a metal nitride, a metal carbide, or a combination thereof. The metal gate conductive layer 110L may be formed through an ALD process.

Referring to FIGS. 19A to 19C, the metal gates 110 are formed by removing the upper portions of the metal gate conductive layer 110L and the spacers 116 through an etching process. Recesses may be formed on the metal gates 110 between interlayer insulation layers 120. A cap layer nitride layer 115a may be formed in the recesses (e.g., a silicon nitride layer). The cap layer nitride layer 115a may also be formed on the interlayer insulation layer 120. A planarization process, e.g., a CMP process, may be performed to remove the upper portion of the cap layer nitride layer 115a until the top surface of the interlayer insulation layer 120 is opened, thereby forming the cap layer 115. The cap layer 115 may be formed to be automatically aligned with the metal gate 110 through a process of filling and planarizing recesses. In this regard, the cap layer 115 may be formed through a self-alignment process.

The interlayer insulation layer 120 is etched to form a contact hole for opening the source/drain region 130. The source/drain contact 180 is formed the contact hole is formed. According to some embodiments, before the source/drain contact 180 is formed, a metal silicide layer may be formed on the source/drain region 130 opened by the contact hole. When the metal silicide layer is formed, the source/drain contact 180 may be formed on the metal silicide layer.

When the source/drain contact 180 is formed, the buried oxide layer 160 may be maintained in the second recess region R2. Thereafter, the semiconductor device 100 of FIG. 1 may be manufactured by removing the buried oxide layer 160 through a CMP process. As shown in FIG. 2C, a portion of the buried oxide layer 160 (e.g., a portion of the buffer layer 162 or the buffer layer 162 and a portion of the upper oxide layer 164) may be maintained. However, according to some embodiments, the buried oxide layer 160 may be completely removed.

In the method of manufacturing a semiconductor device according to embodiments, in the second recess region R2 (i.e., the gate cut region CTar), the first nitride layer 150 on the interlayer insulation layer 120 may be removed, thereby opening the top surface of the interlayer insulation layer 120 and maintaining the first nitride layer 150 only inside the hole H. Therefore, in a subsequent process, it is possible to effectively prevent an etching defect of the interlayer insulation layer 120 due to the remaining of the first nitride layer 150 and a discontinuation defect of a source/drain contact due to the etching detect.

For example, when it is checked whether a first nitride layer remains on the interlayer insulation layer 120 in the second recess region R2, in the case of the method of manufacturing a semiconductor device according to the above-stated comparative example, hundreds of residual first nitride layers are detected at 1500 points. However, in the method of manufacturing a semiconductor device, no remaining first nitride layer is detected at all. Therefore, when the method of manufacturing a semiconductor device is applied to logic devices, the production yield may be increased by 10% or more. Also, when the method of manufacturing a semiconductor device is applied to SRAMs, the discontinuation defect of a source/drain contact may be reduced by 20% or more.

Figure 20A:
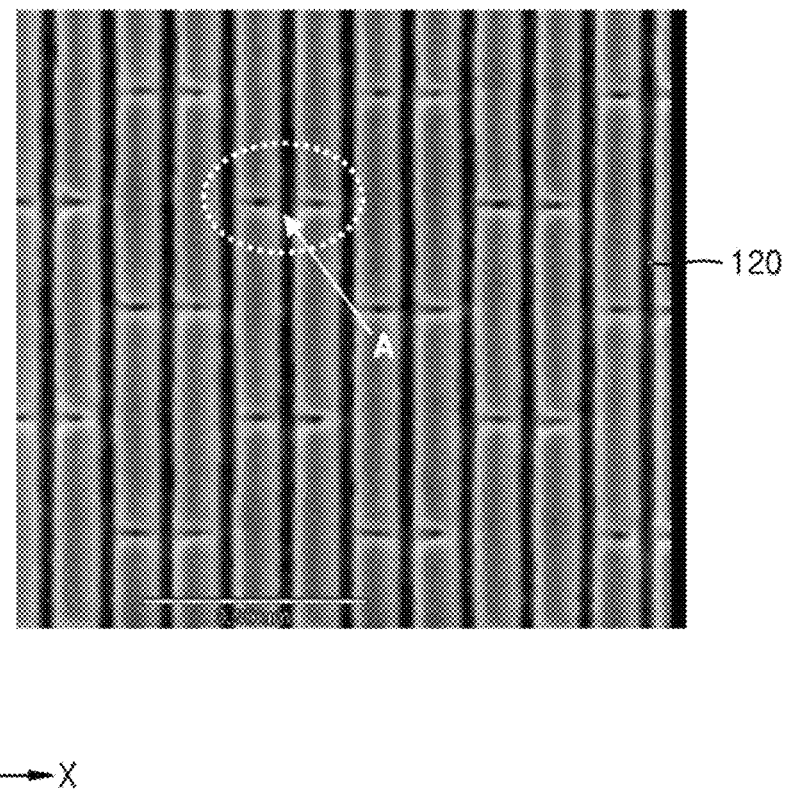
FIGS. 20A and 20B are SEM image of the top surface of a semiconductor device after a replacement metal gate (RMG) process and after formation of contacts and a chemical mechanical polishing (CMP) process before a middle of line (MOL) process and an SEM image of the top surface of a semiconductor device according to a comparative example corresponding to the semiconductor device of FIG. 20A, respectively.
Figure 20B:
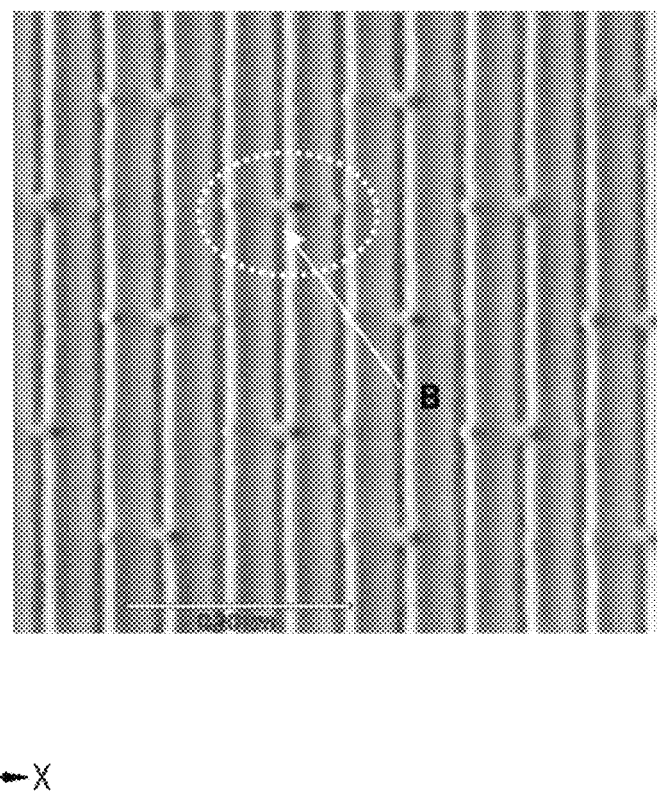

FIGS. 20A and 20B are an SEM image of the top surface of a semiconductor device after a replacement metal gate (RMG) process and after formation of contacts and a CMP process before a middle of line (MOL) process, and an SEM image of the top surface of a semiconductor device according to a comparative example corresponding to the semiconductor device of FIG. 20A, respectively.

Referring to FIGS. 20A and 20B, in the case of the method of manufacturing a semiconductor device, as indicated by the arrow A inside the dotted circle of FIG. 20A, the first nitride layer 150 is divided into two parts and the interlayer insulation layer 120 clearly extends therebetween. In FIG. 20A, a thin line extending in the first direction (X direction) may correspond to the first nitride layer 150, and a black line extending in the second direction (Y direction) may correspond to the interlayer insulation layer 120.

On the other hand, in the case of the above-stated comparative example, as indicated by the arrow B inside the dotted circle of FIG. 20B, the first nitride layer 150 is continuous, and thus the interlayer insulation layer 120 is cut by the first nitride layer 150. This is because two parts of the first nitride layer 150 are not completely separated and connected to each other through the portion of the first nitride layer 150 remaining on the second recess region R2. Here, the MOL process refers to a process of forming intermediate wires.

While aspects of example embodiments have been particularly shown and described, it will be understood that various changes in form and details may be made therein without departing from the spirit and scope of the following claims.

What is claimed is:

1. A method of manufacturing a semiconductor device, the method comprising:
forming, on a substrate, dummy gate structures extending in a first direction, spaced apart from one another along a second direction perpendicular to the first direction, and each comprising a dummy gate and a gate mask pattern;
forming a first oxide layer on the dummy gate structures;
removing upper portions of the first oxide layer and the dummy gate structures through chemical mechanical polishing (CMP) to expose the dummy gate;
etching an upper portion of the first oxide layer and the dummy gate by using a hard mask pattern to form a recessed region;
providing a first nitride layer in the recessed region;
removing an upper portion of the first nitride layer to expose the first oxide layer;
forming a second oxide layer on the first nitride layer and the first oxide layer;
removing an upper portion of the second oxide layer and the hard mask pattern to expose the dummy gate;
partially removing upper portions of the first oxide layer and the second oxide layer; and
providing a second nitride layer on the first oxide layer and the second oxide layer.

2. The method of claim 1, further comprising forming a buffer oxide layer on the first nitride layer and the first oxide layer,
wherein the second oxide layer is formed on the buffer oxide layer.

3. The method of claim 2, wherein the removing the upper portion of the first nitride layer comprises forming a recess in an upper portion of the dummy gate, and
wherein the buffer oxide layer is provided on the first oxide layer and in the recess.

4. The method of claim 1, wherein the dummy gate comprises polysilicon, and
wherein the etching the first oxide layer and the dummy gate comprises removing the dummy gate.

5. The method of claim 1, wherein the dummy gate structures further comprise spacers on side surfaces of the dummy gate,
wherein in the recessed region, the first oxide layer and the first nitride layer are alternately arranged along the second direction, and
wherein the spacers are arranged between the first oxide layer and the first nitride layer.

6. The method of claim 1, wherein the first nitride layer, the second oxide layer, and the second nitride layer are sequentially stacked in the recessed region in a direction perpendicular to a top surface of the substrate.

7. The method of claim 1, wherein a nano-sheet is under the dummy gate, and
wherein the method further comprises:
removing the dummy gate;
forming a metal gate;
removing the second nitride layer and the second oxide layer;
removing the first oxide layer; and
forming a contact.

8. The method of claim 7, wherein, in the forming of the contact, the first nitride layer is not present on the first oxide layer.

9. The method of claim 7, wherein, in the removing of the second nitride layer and the second oxide layer, a portion of the second oxide layer is maintained on the first nitride layer and the first oxide layer, and
wherein the forming the contact comprises removing the second oxide layer on the first oxide layer.

10. The method of claim 1, further comprising:
forming a fin and a nano-sheet on the substrate; and
forming source and drain regions connected to the nano-sheet, on the substrate on both sides of the dummy gate structures in the second direction.

11. A method of manufacturing a semiconductor device, the method comprising:
forming a fin and a nano-sheet on a substrate;
forming, on the nano-sheet, dummy gate structures extending in a first direction, spaced apart from one another along a second direction perpendicular to the first direction, and each comprising a dummy gate and a gate mask pattern;
forming source and drain regions connected to the nano-sheet, on the substrate between the dummy gate structures;
forming a first oxide layer on the source and drain regions and the dummy gate structures;
removing upper portions of the first oxide layer and the dummy gate structures through chemical mechanical polishing (CMP) to expose the dummy gate;
etching an upper portion of the first oxide layer and the dummy gate by using a hard mask pattern to form a recessed region;
providing a first nitride layer in the recessed region;
removing an upper portion of the first nitride layer to expose the first oxide layer;
forming a second oxide layer on the first nitride layer and the first oxide layer;
removing an upper portion of the second oxide layer and the hard mask pattern to expose the dummy gate;
removing upper portions of the first oxide layer and the second oxide layer;
forming a second nitride layer on the first oxide layer and the second oxide layer;
removing the dummy gate;
forming a metal gate;
removing the second nitride layer and the second oxide layer;
removing the first oxide layer; and
forming a contact.

12. The method of claim 11, further comprising forming a buffer oxide layer on the first nitride layer and the first oxide layer,
wherein the second oxide layer is formed on the buffer oxide layer.

13. The method of claim 11, wherein the first nitride layer, the second oxide layer, and the second nitride layer are sequentially stacked in the recessed region in a direction perpendicular to a top surface of the substrate.

14. A semiconductor device comprising:
a semiconductor substrate;
fins protruding from the semiconductor substrate, extending in a first direction, and spaced apart from one another along a second direction perpendicular to the first direction;
a plurality of nano-sheets spaced apart from top surfaces of the fins and extending in the first direction parallel to the top surfaces of the fins;
metal gates extending in the second direction, spaced apart from each other along the first direction, and surrounding the plurality of nano-sheets with a gate insulation layer provided therebetween; and a nitride layer and a first oxide layer provided in a gate cut region between the metal gates, wherein the first oxide layer is provided on the nitride layer and extends past the nitride layer.

15. The semiconductor device of claim 14, wherein in the gate cut region, the nitride layer and a second oxide layer are alternately arranged along the first direction between two of the metal gates.

16. The semiconductor device of claim 15, wherein, in the gate cut region, the first oxide layer is provided on both the nitride layer and the second oxide layer.

17. The semiconductor device of claim 14, wherein the first oxide layer has a double layer structure.

18. The semiconductor device of claim 14, wherein the first oxide layer is provided in a recess formed on a top surface of the nitride layer.

19. The semiconductor device of claim 14, wherein spacers are provided on sidewalls of the metal gates and sidewalls of the nitride layer.

20. The semiconductor device of claim 14, further comprising a contact between the metal gates and the nitride layer.

* * * * *